United States Patent
Bonar et al.

(10) Patent No.: US 10,211,371 B2
(45) Date of Patent: Feb. 19, 2019

(54) SEMICONDUCTOR MODIFICATION PROCESS FOR CONDUCTIVE AND MODIFIED ELECTRICAL REGIONS AND RELATED STRUCTURES

(71) Applicant: Facebook Technologies, LLC, Menlo Park, CA (US)

(72) Inventors: James Ronald Bonar, Erskine (GB); Gareth Valentine, York (GB); Stephen Warren Gorton, Edinburgh (GB); Zheng Gong, Glasgow (GB); James Small, Refrewshire (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/118,684

(22) PCT Filed: Feb. 13, 2015

(86) PCT No.: PCT/GB2015/050408
§ 371 (c)(1),
(2) Date: Aug. 12, 2016

(87) PCT Pub. No.: WO2015/121665
PCT Pub. Date: Aug. 20, 2015

(65) Prior Publication Data
US 2017/0047481 A1    Feb. 16, 2017

(30) Foreign Application Priority Data
Feb. 13, 2014  (GB) .................................. 1402508.4

(51) Int. Cl.
*H01S 3/00*    (2006.01)
*H01S 5/00*    (2006.01)
(Continued)

(52) U.S. Cl.
CPC ........ *H01L 33/145* (2013.01); *H01L 33/0075* (2013.01); *H01L 33/0095* (2013.01);
(Continued)

(58) Field of Classification Search
CPC . H01L 33/02; H01L 33/06; H01L 2221/6835; H01L 2924/0002; H01L 33/42;
(Continued)

(56) References Cited

U.S. PATENT DOCUMENTS

2003/0010975 A1*  1/2003  Gibb ..................... H01L 33/40
                                                          257/40
2005/0194584 A1   9/2005  Slater
(Continued)

FOREIGN PATENT DOCUMENTS

WO       2013/117944 A1    8/2013
WO    WO 2013117944 A1 *   8/2013   ............. H01L 33/42

OTHER PUBLICATIONS

International search report for PCT/GB2015/050408, dated May 18, 2015.

*Primary Examiner* — Whitney Moore
(74) *Attorney, Agent, or Firm* — Fenwick & West LLP

(57) ABSTRACT

There is herein described a process for providing improved device performance and fabrication techniques for semiconductors. More particularly, the present invention relates to a process for forming features, such as pixels, on GaN semiconductors using a p-GaN modification and annealing process. The process also relates to a plasma and thermal anneal process which results in a p-GaN modified layer where the annealing simultaneously enables the formation of conductive p-GaN and modified p-GaN regions that behave in an n-like manner and block vertical current flow. The process also extends to Resonant-Cavity Light Emitting Diodes
(Continued)

(RCLEDs), pixels with a variety of sizes and electrically insulating planar layer for electrical tracks and bond pads.

17 Claims, 24 Drawing Sheets

(51) Int. Cl.
| | |
|---|---|
| H01S 5/02 | (2006.01) |
| H01S 5/20 | (2006.01) |
| H01L 33/00 | (2010.01) |
| H01L 33/10 | (2010.01) |
| H01L 33/14 | (2010.01) |
| H01L 33/58 | (2010.01) |
| H01S 5/042 | (2006.01) |
| H01S 5/183 | (2006.01) |
| H01S 5/187 | (2006.01) |
| H01S 5/343 | (2006.01) |

(52) U.S. Cl.
CPC ............ *H01L 33/105* (2013.01); *H01L 33/58* (2013.01); *H01S 3/005* (2013.01); *H01S 5/00* (2013.01); *H01S 5/0422* (2013.01); *H01S 5/0425* (2013.01); *H01S 5/183* (2013.01); *H01S 5/187* (2013.01); *H01S 5/18308* (2013.01); *H01S 5/18341* (2013.01); *H01S 5/2068* (2013.01); *H01S 5/34333* (2013.01); H01S 5/021 (2013.01); H01S 5/2086 (2013.01)

(58) Field of Classification Search
CPC .................. H01L 33/405; H01L 33/60; H01L 2221/68359; H01L 2924/12043
See application file for complete search history.

(56) References Cited

U.S. PATENT DOCUMENTS

| | | | |
|---|---|---|---|
| 2006/0002442 A1 | 1/2006 | Haberern | |
| 2009/0242929 A1* | 10/2009 | Lin | ........................ H01L 33/145 257/103 |
| 2010/0032701 A1 | 2/2010 | Fudeta | |
| 2011/0155999 A1* | 6/2011 | Tansu | ...................... H01L 33/22 257/13 |
| 2014/0014998 A1* | 1/2014 | Ohno | .................... H01S 5/0425 257/99 |
| 2016/0211420 A1* | 7/2016 | Donofrio | ................ H01L 33/46 |
| 2017/0236974 A1* | 8/2017 | Malinverni | ............. H01L 33/14 372/46.01 |

* cited by examiner

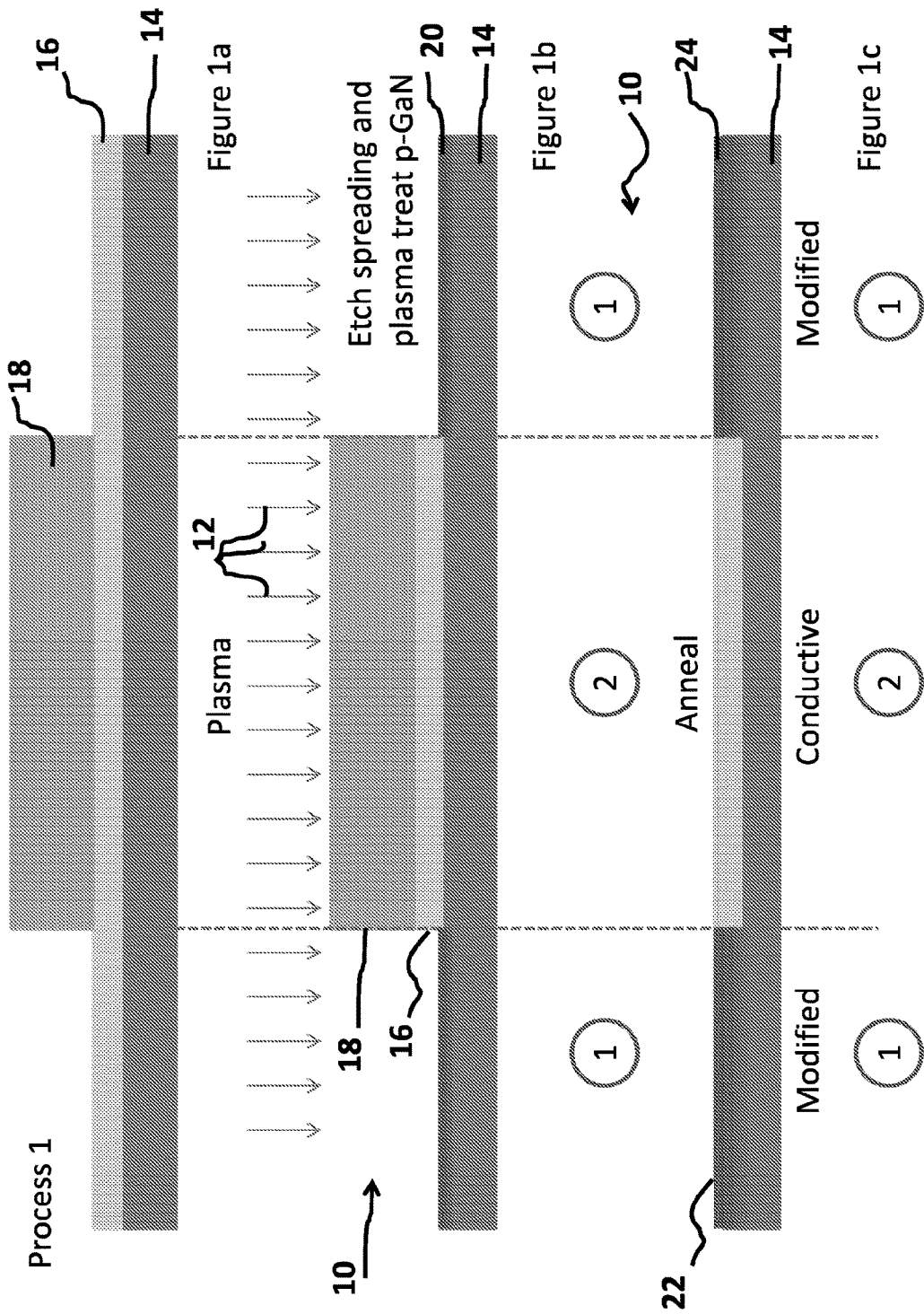

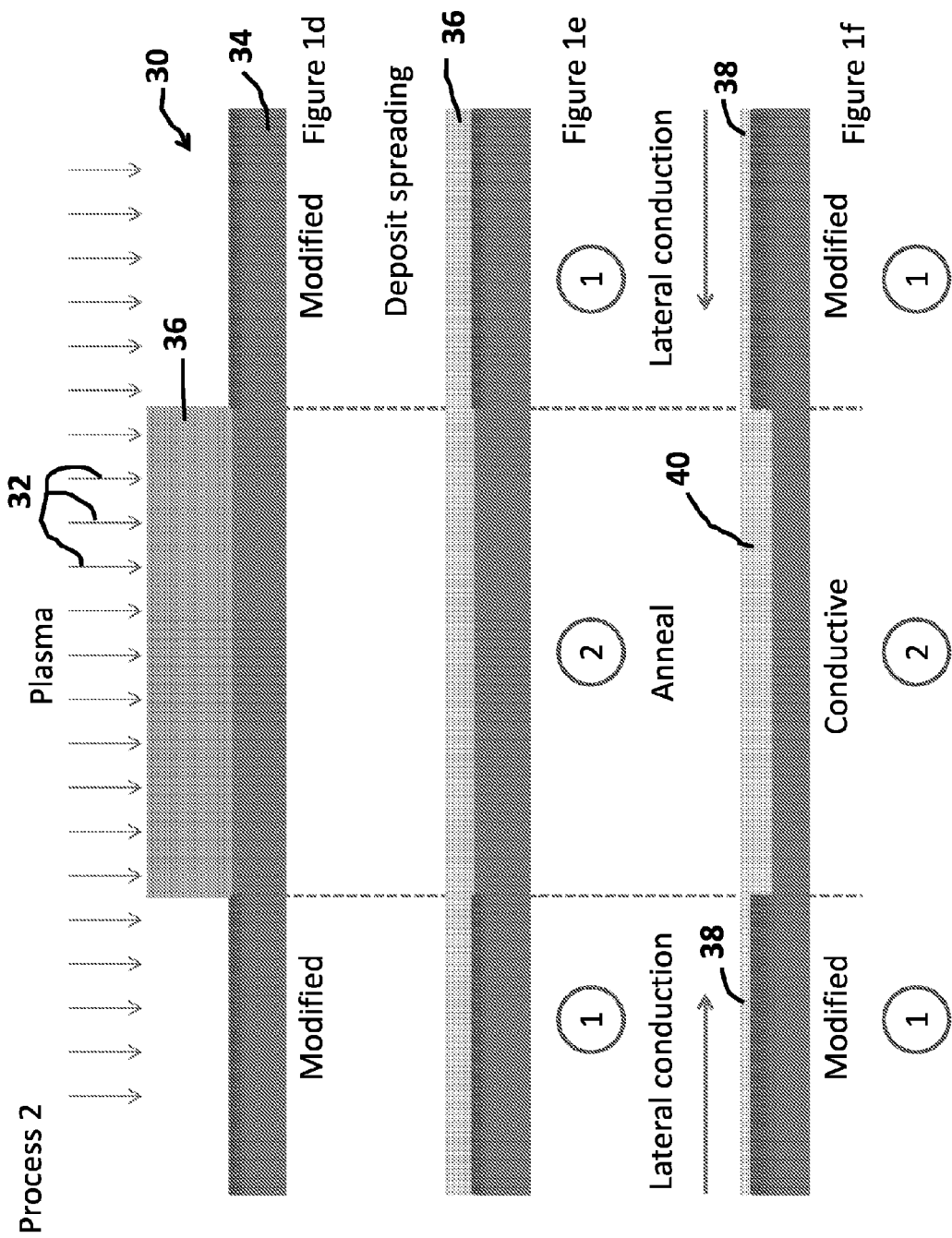

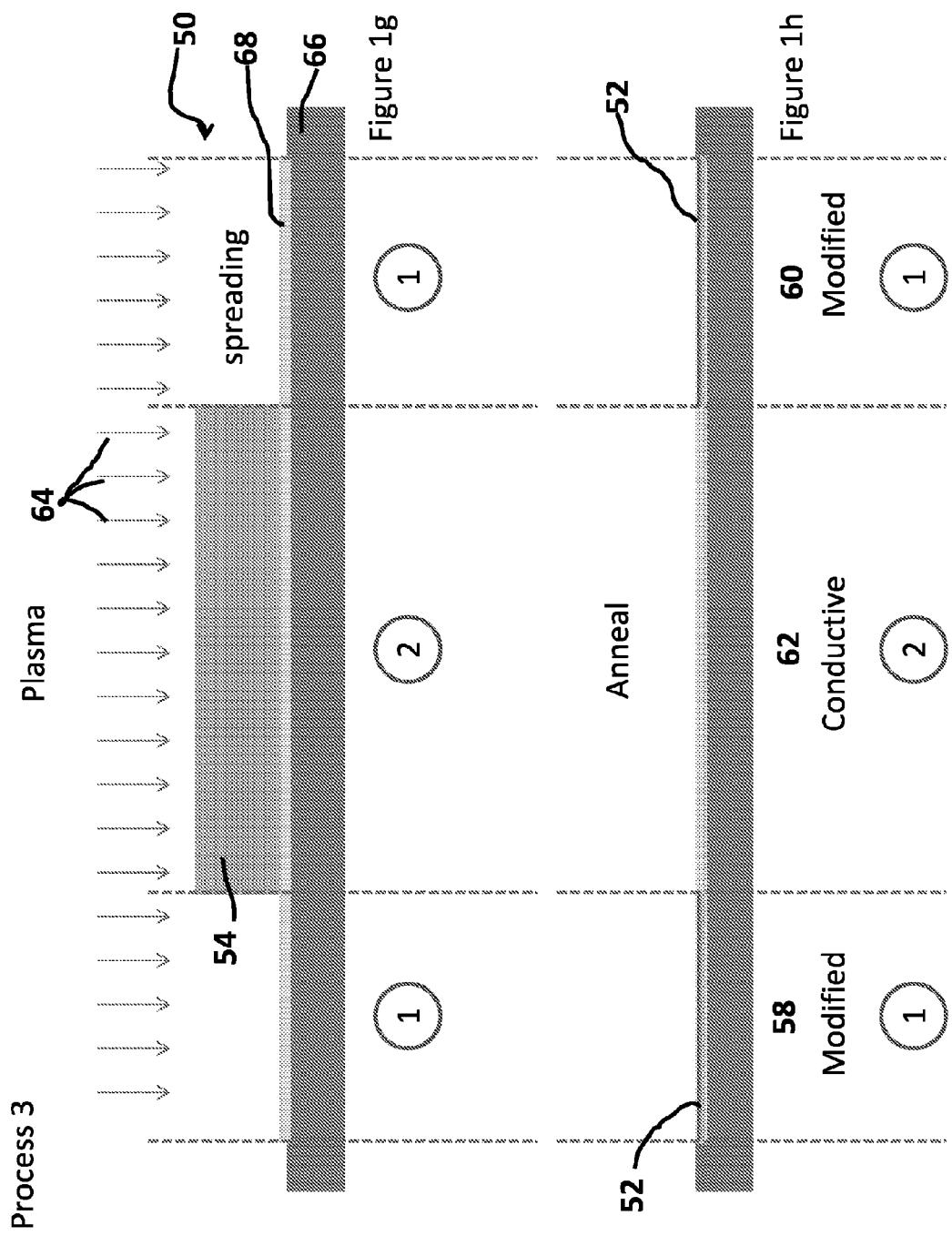

Test Structure: IV for connection to ohmic and Schottky contacts

Test Structure: IV for connection to adjacent ohmic contacts

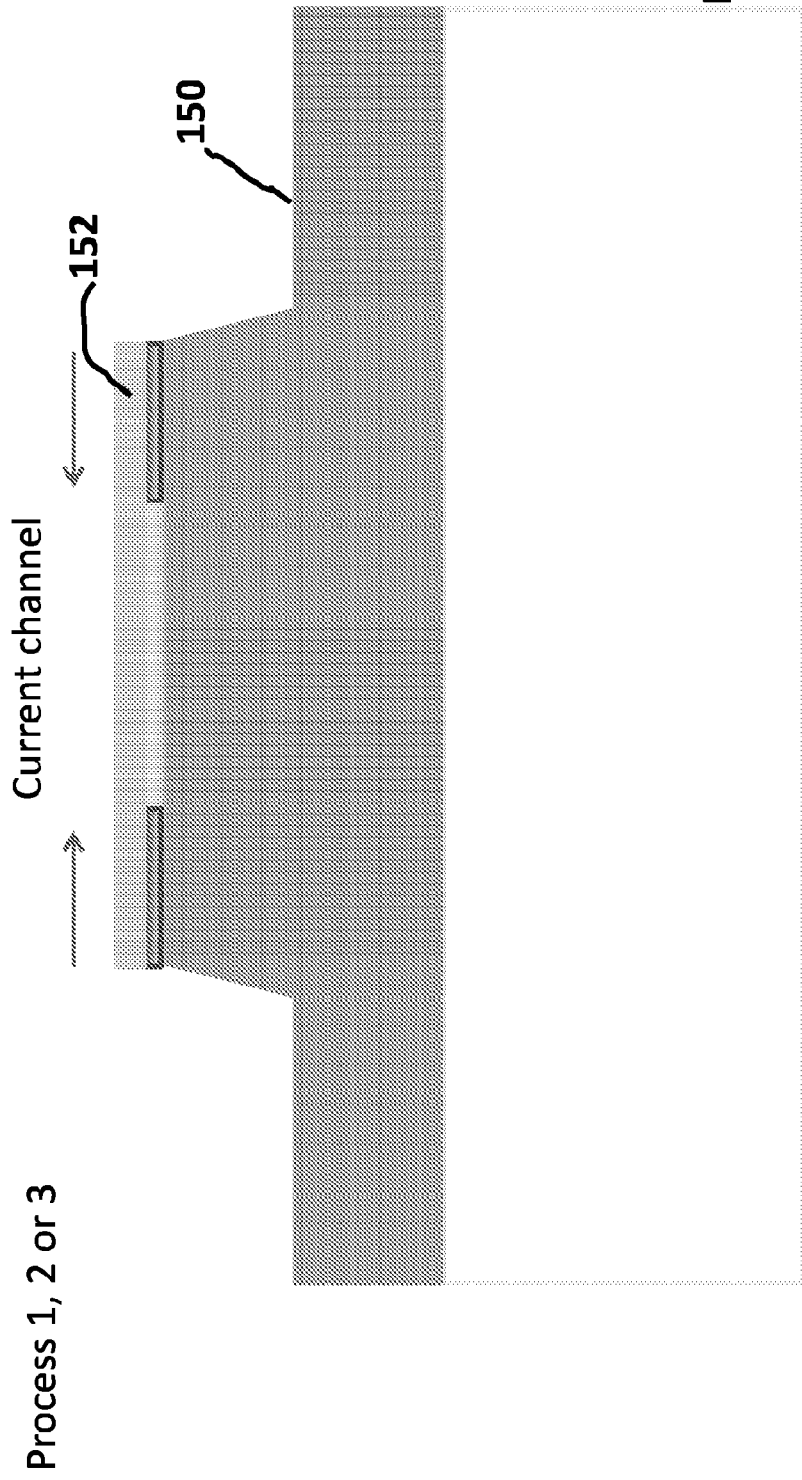

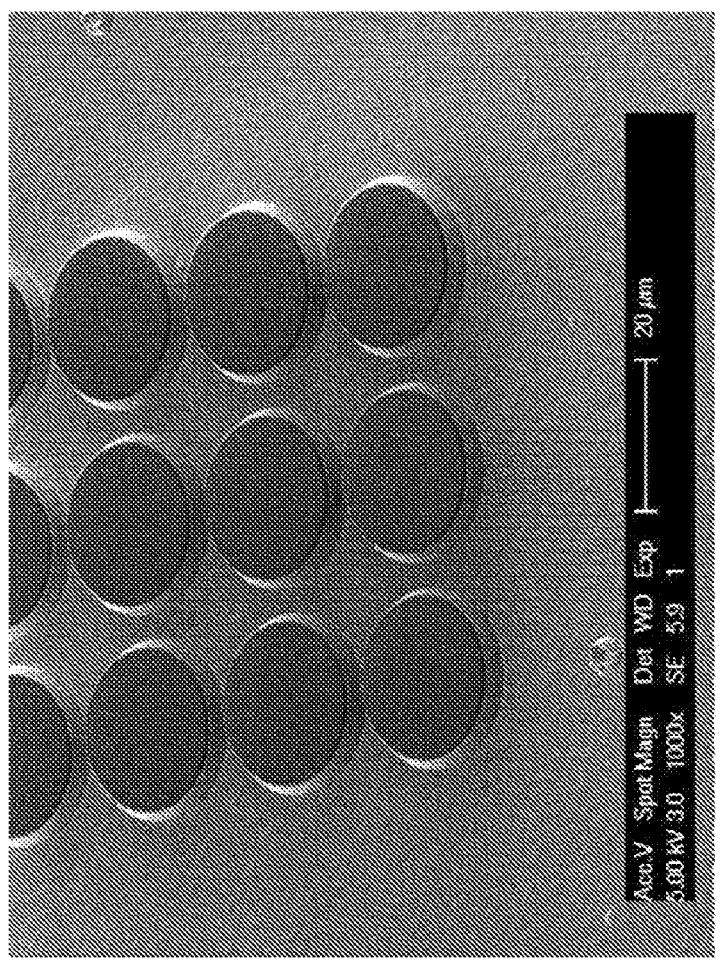
Figure 7b ii SEM of an array of larger pixels where the sidewall angle is controlled to ~40°. A smaller ohmic contact is formed in the centre of the pixel.

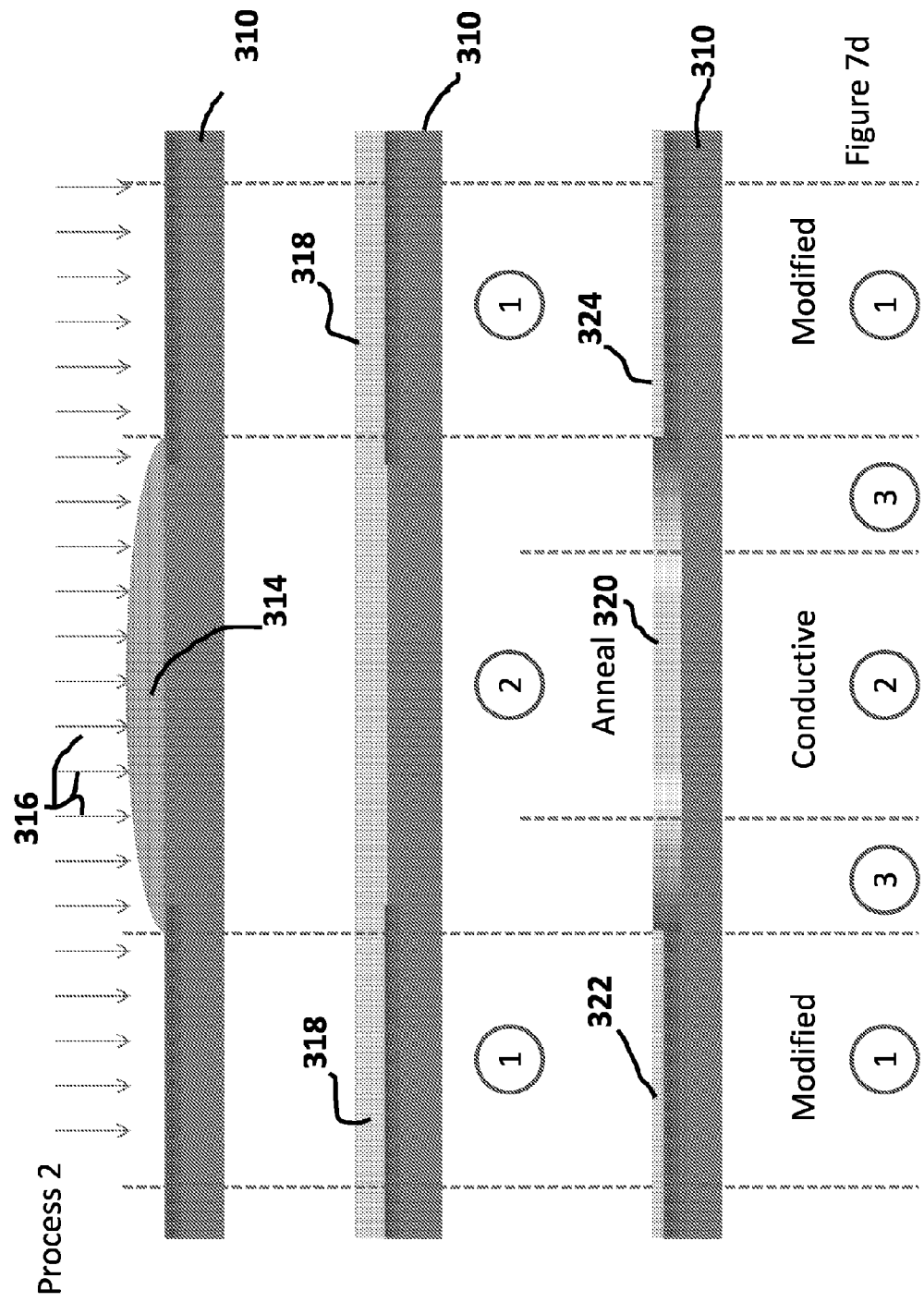

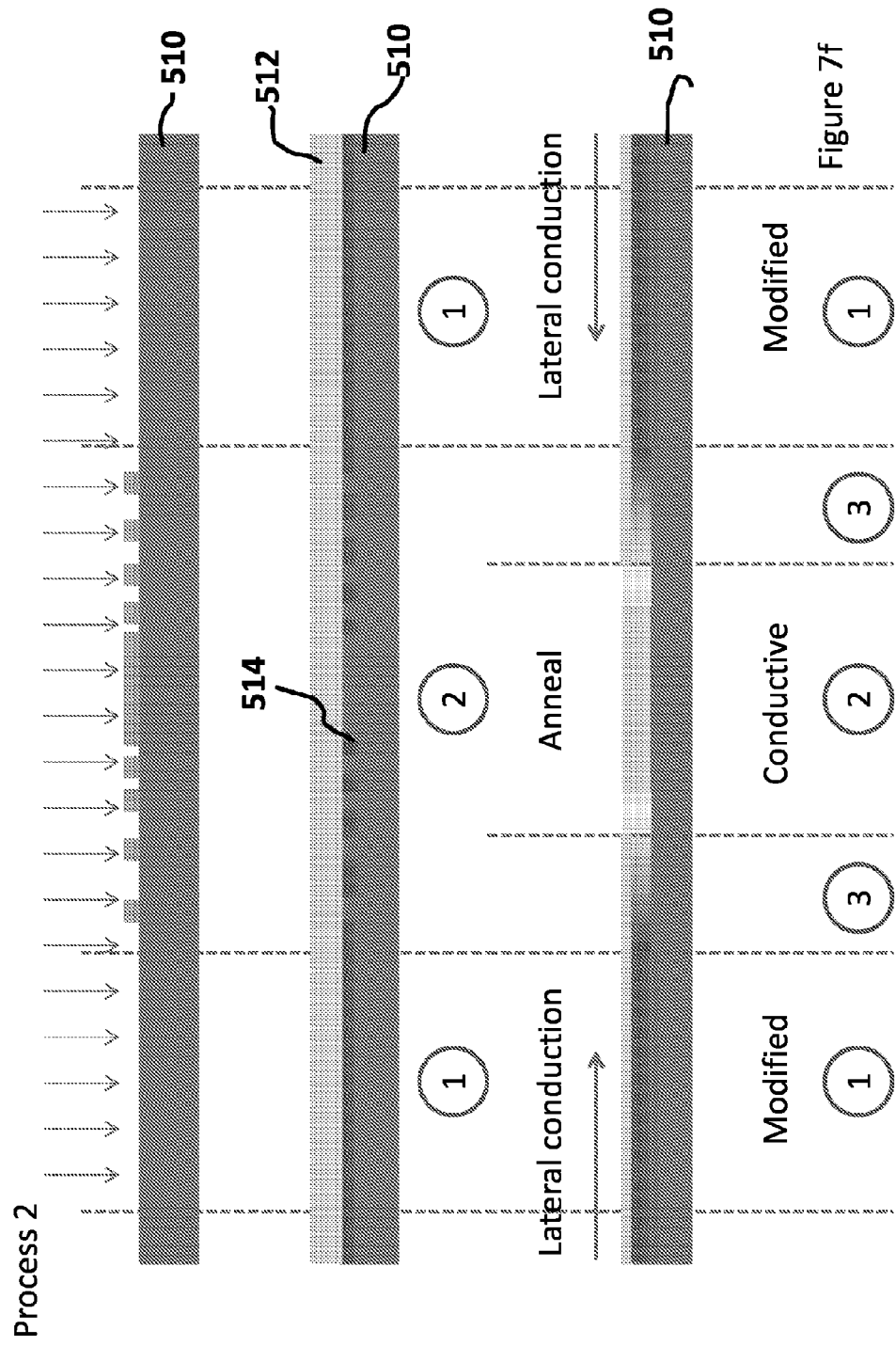

- Structure to form electrical contacts- bond pads (height)
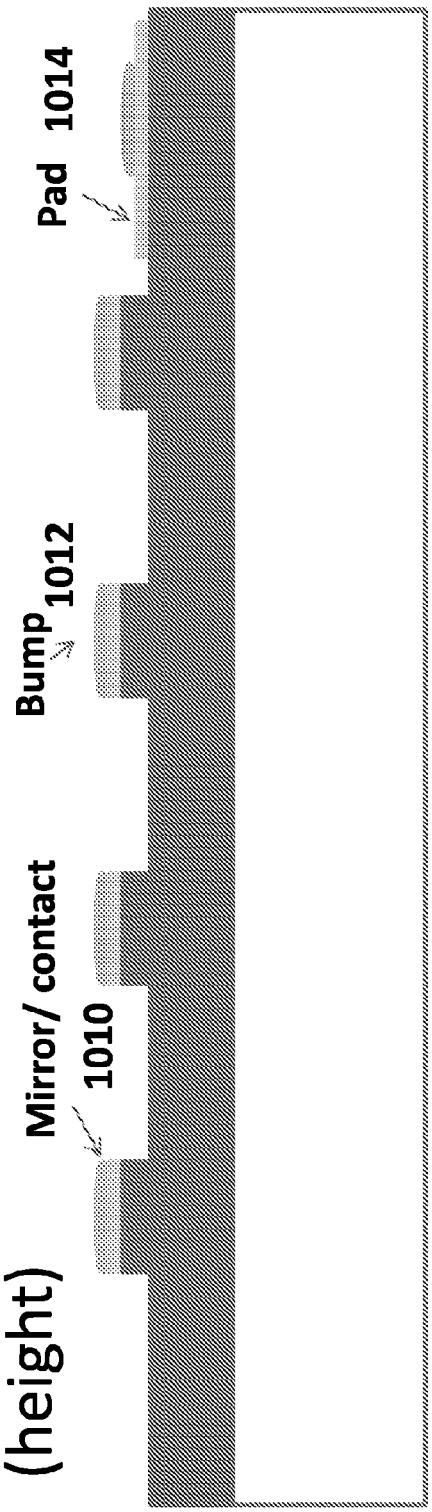
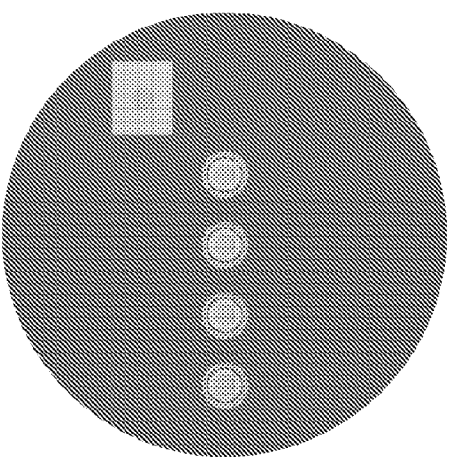
Figure 12a

- Electrical contacts- tracks & bond pads
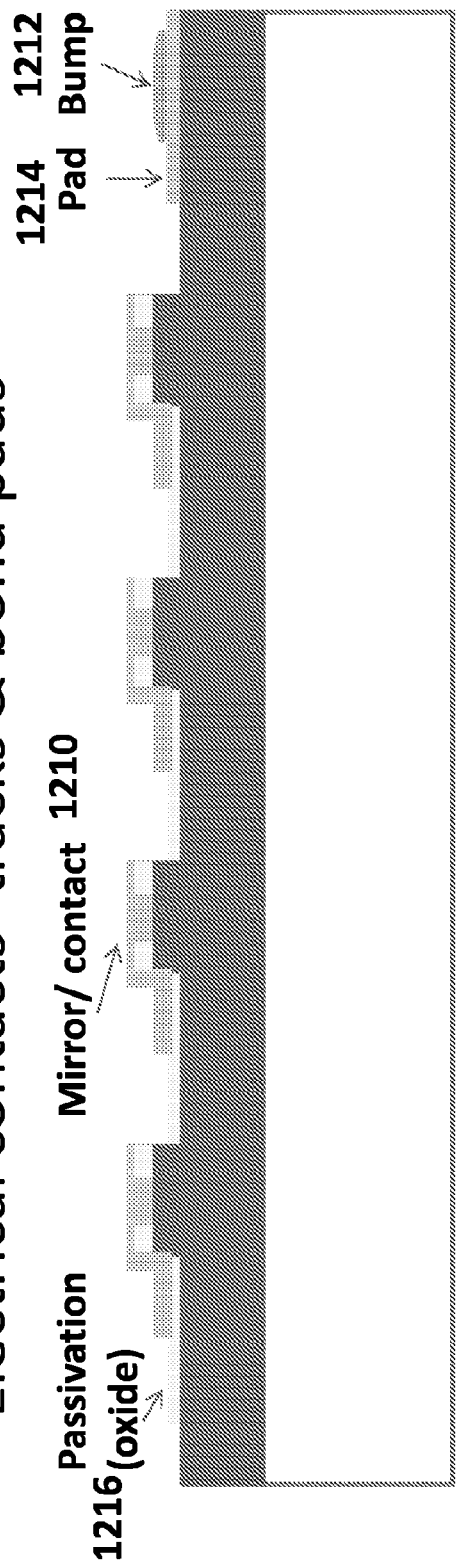
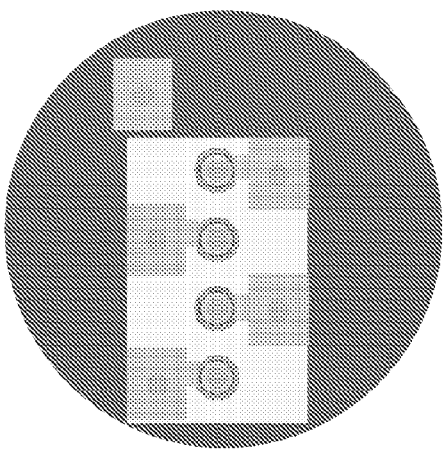
Figure 12c

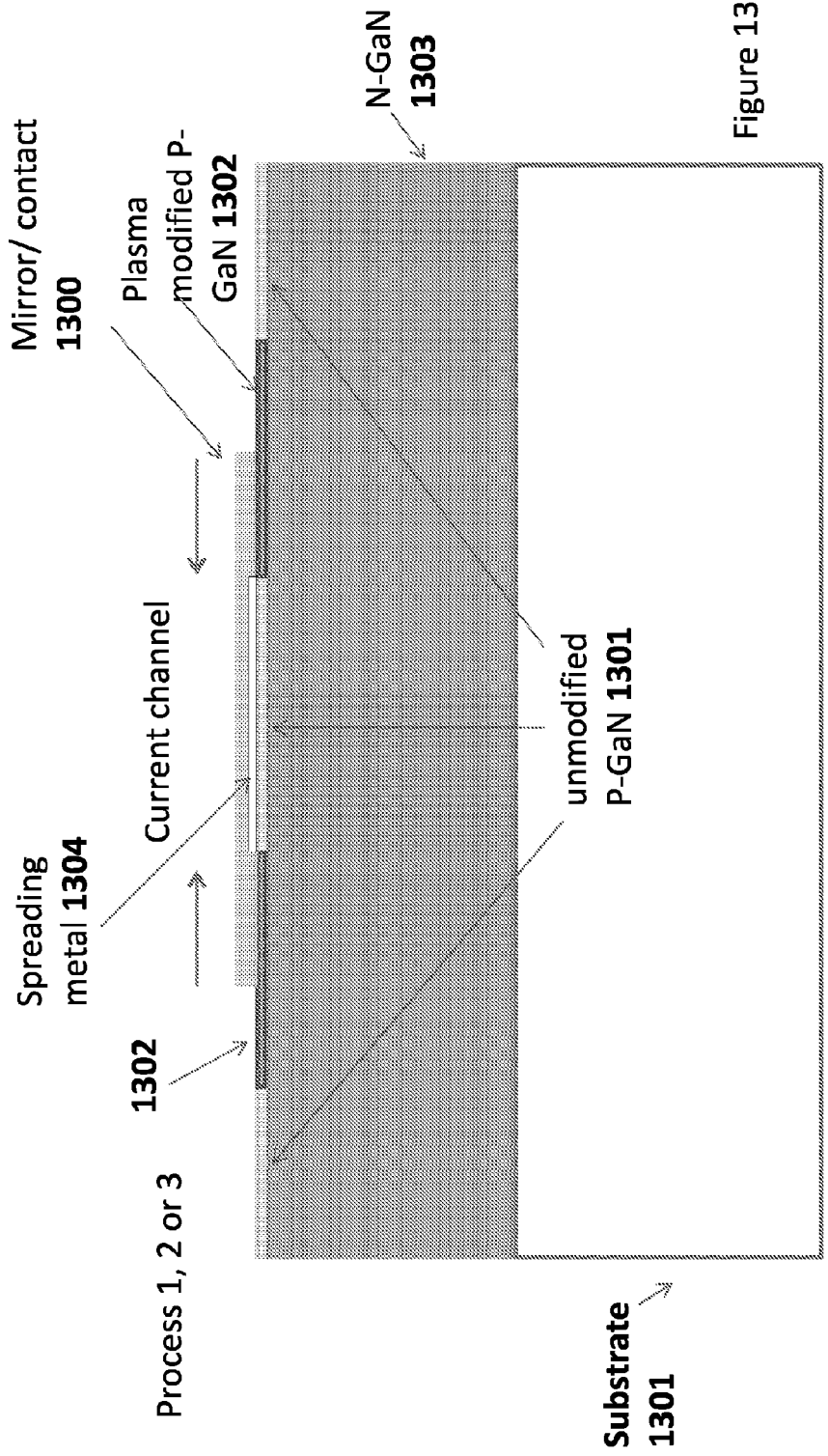

SEMICONDUCTOR MODIFICATION PROCESS FOR CONDUCTIVE AND MODIFIED ELECTRICAL REGIONS AND RELATED STRUCTURES

CROSS-REFERENCE TO RELATED APPLICATIONS

This application is a National Stage application of International Application No. PCT/GB2015/050408, filed Feb. 13, 2015. This application also claims priority under 35 U.S.C. § 119 to Great Britain Application No. 1402508.4, filed Feb. 13, 2014.

FIELD OF THE INVENTION

The present invention relates to a process for providing improved device performance and fabrication techniques for semiconductors. More particularly, the present invention relates to a process for forming features, such as pixels, on GaN semiconductors using a p-GaN with modified electrical characteristics through a plasma treatment and annealing process. The process also relates to a plasma and thermal anneal process which results in a p-GaN layer where the annealing simultaneously enables the formation of conductive and modified electrical regions. The process also extends to Resonant-Cavity Light Emitting Diodes (RCLEDs), pixels with a variety of sizes and electrically modified planar layer for electrical tracks and bond pads.

BACKGROUND OF THE INVENTION

There is a need for forming small structures in semiconductors in a robust and repeatable manner. However, to form small pixels is very challenging using standard semiconductor processing techniques. This is exacerbated if there are topographical features which leads to complications in processing, even when using high resolution lithography tools. Also, additional thermal processing is known to impact on the efficiency of emissive devices such as LEDs, RCLEDs, VCSELs, etc. Thus, the ability to form electrically modified and conductive regions in one thermal processing step is an added benefit.

The ability to form structures by channeling a current into a p-n junction with reduced electrical leakage is important but becomes even more acute for smaller pixels owing to the increase in contact resistance related to the small contact area. Hence there is a need to effectively reduce current leakage.

The ability to form structures with an emission profile which is non-uniform (e.g. linear) can be a desirable feature. As an example, LED pixels fabricated to have a Gaussian type profile, retain a Gaussian intensity profile when coupled to optical elements i.e. lenses.

The present invention also provides the ability to eliminate passivation with oxide by use of converted p-GaN with modified electrical properties.

It is an object of at least one aspect of the present invention to obviate or mitigate at least one or more of the aforementioned problems.

It is a further object of at least one aspect of the present invention to provide a process for forming small pixels on semiconductors with reduced current leakage.

It is a further object of at least one aspect of the present invention to provide a process for forming pixels with a nonlinear beam profile.

It is a further object of at least one aspect of the present invention to eliminate and/or reduce the need for passivation and to simplify device processing.

It should be noted that for any of the objects of the present invention they may be treated as an inclusive "or". As an example, a condition A (small pixel) or B (nonlinear emission profile) is satisfied by any one of the following: A is present and B is not present, A is not present and B is present and both A and B are present.

SUMMARY OF THE INVENTION

According to a first aspect of the present invention there is provided a semiconductor fabrication process comprising the following steps:
  depositing a first spreading layer on top of a p-layer;
  depositing a mask feature onto the first spreading layer to form a layered structure wherein some areas of the spreading layer are protected by the mask feature and others are not;
  then exposing the layered structure to an etch (plasma or dry) to remove the first spreading layer from the areas not protected by the mask;
  then exposing the structure including masked and bare p-GaN areas to a plasma treatment;
  followed by removing the mask layer from the structure
  then annealing the plasma treated layered structure;
  wherein the areas not protected by the mask feature are exposed to the plasma treatment and form regions with modified electrical characteristics due to the plasma and annealing process and the areas protected by the mask are shielded from the plasma treatment and after annealing form conductive contact e.g. ohmic contacts at the layers protected by the mask feature.

It has been found that it is the combination of the plasma and annealing process which causes an effective electrically resistive behaviour. Although not wishing to be bound by theory it is thought that the plasma is primarily responsible and the thermal process retains or promotes the modified behaviour.

According to a second aspect of the present invention there is provided a semiconductor fabrication process comprising the following steps:
  depositing a mask feature onto the p-GaN layer wherein some areas of the p-GaN are protected by the mask feature and others are not;
  then exposing the structure including masked and bare p-GaN areas to a plasma treatment;
  followed by removing the mask layer from the structure
  depositing a first spreading layer on top of the plasma treated p-layer;
  then annealing the plasma treated layered structure;
  wherein the areas not protected by the mask feature are exposed to the plasma treatment and form regions with modified electrical characteristics due to the plasma and annealing process and the areas protected by the mask are shielded from the plasma treatment and after annealing form conductive contact e.g. ohmic contact at the layers protected by the mask feature. As a further feature the unprotected layers whilst remaining highly resistive to vertical currents through the GaN layer permits lateral current conduction across the spreading layer so that the drive current is channeled efficiently to the protected conductive region.

According to a third aspect of the present invention there is provided a semiconductor fabrication process comprising the following steps:

depositing a first spreading layer of suitable thickness e.g. less than or equal to 20 nm in thickness on top of a p-layer;

depositing a mask feature onto the first spreading layer to form a layered structure wherein some areas of the spreading layer are protected by the mask feature and others are not;

then exposing the layered structure to a plasma treatment;

then exposing the structure including masked and bare p-GaN areas to a plasma treatment;

followed by removing the mask layer from the structure then annealing the plasma treated layered structure;

wherein the areas not protected by the mask feature are exposed to the plasma treatment and form regions with modified electrical characteristics due to the plasma and annealing process and the areas protected by the mask are shielded from the plasma treatment and after annealing form conductive contact e.g. ohmic contact at the layers protected by the mask feature. As a further feature the unprotected layers whilst remaining highly resistive to vertical currents through the GaN layer also permit no or little (parasitic) lateral current conduction across the associated spreading layer.

Generally speaking, the present invention therefore resides in the provision of providing improved device performance and fabrication techniques for semiconductors such as GaN semiconductors.

It is preferable in the present invention that the annealing process occurs after the plasma irradiation step. It is this series of steps that has been found to provide improved fabrication. Using this process the present invention forms simultaneous conductive and modified vertical current blocking sections of p-GaN material in-situ. These three processes can be used to form a range of devices with the added advantage of being able to form planar structures with very high resolution such as less than 10 μm and even less than 2 μm.

The p-layer may be GaN.

The electrical current spreading layer on top of the GaN p-layer may be thin metal or transparent conductive oxide.

The mask feature may be a patterned mask and can therefore be used to form a wide variety of structures.

In some instances e.g. using Ni/Au spreading metal, it has been found that the spreading layer needs to have the mask removed when annealing as it promotes the reaction to form a good contact.

The formed conductive contacts may, for example, be ohmic contacts at the layers protected by the mask feature. Alternatively, the conductive contacts may be Schottky contacts.

The spreading layer in preferred embodiments may be Ni/Au. In alternative embodiments the spreading layer may selected from any one of or combination of the following: Ni/Pt; Au/Pt; Pt/Ni/Au; Ni/Ag or Pd; ITO; Ni/ITO or any other type of material known to those skilled in the art.

The plasma may be any suitable plasma. In preferred embodiments the plasma may be $CHF_3$. In alternative embodiments the plasma may be selected from any one of or combination of the following: Ar or $CHF_3$/Ar or $C_2F_6$ or $CF_4$ or $H_2$ or a range of different plasmas and combinations known to those skilled in the art.

The plasma may be used for a period of 3000 sec and with a plasma power of 200 Watts and a gas flow of 20 sccm or a range of different plasma exposure conditions known to those skilled in the art.

The annealing process may include using a furnace to a temperature of about 500° C. or alternatively the structure may be subjected to Rapid Thermal Annealing (RTA) for a time of 120 sec to a temperature of about 500° C. or a range of different annealing conditions known to those skilled in the art. The ability to only require one annealing process to form conductive and modified regions is also beneficial as it does not subject the device to further high temperature processing. This impacts favourably on device performance and also helps with further processing steps.

Using the mask feature means that the mask will protect some areas from the plasma treatment process and others not. Parts of the layer structure not protected when exposed to the plasma may be modified and become non-conductive to vertical currents through the p-GaN.

The areas protected with the mask feature are protected from the plasma and on annealing form a conductive structure.

The process of the present invention may be used to form a variety of structures such as very fine pixels with dimensions that may e.g. be less than 10 μm. Of particular advantage is that the present invention provides access to less than 2 μm diameter pixel structures such as micro LED structures.

The p-contact (or 'p-material) modification process is a method which lithographically forms structures and hence can be implemented to avoid/reduce sidewall induced recombination effects. As an example, a larger mesa can be formed with an accurately controlled smaller planar active area within the mesa.

Etched structures e.g. shaped sidewalls can be implemented to increase the proportion of the generated light to be coupled from the substrate. This effect can be enhanced with smaller pixels (internal reflection or presence of resonant cavity modes). However, non-radiative recombination through crystal lattice defects at the surface of the sidewall [e.g. Shockley-Read-Hall (SRH)] caused by dry etching lead to a reduction in device efficiency. It is thus beneficial not to have an etched feature in the activated quantum well area in a region where both carrier types (hole and electron) are present, and furthermore to have latitude in the processing to define a smooth sidewall. By reducing the diameter of the pixel this reduces the required etch depth required for light to be re-directed through sidewall interaction and also enable the current to be restricted to the required active area. As an example a 4 μm pixel (mirror/contact region) could be formed with an emission diameter controlled to 2 μm using the p-GaN modification process (Process one, two or three) and with an etch depth (mesa height) and a sidewall angle of 1.5 μm and 40°, respectively. In this way, one carrier type (holes) is not present in the active p-n junction region at the etched surface of the sidewall and therefore efficiency reducing SRH recombination does not occur. Forming the contact area from the p-GaN modification process is a preferred route as it effectively channels current from the larger 4 μm mirror/contact to the 2 μm emission area providing an enhanced processing flexibility.

Structures which may be formed include pixels of less than about 10 μm or even less than about 2 μm. The p-GaN modification process detailed can be used in conjunction with standard processing techniques such as metal deposition, plasma etching, passivation, etc. to manufacture a range of different structures.

The present invention may also form at least one or more small active areas in larger area etched pixels. The small active area may be as an example have a size of about 2×2 μm$^2$ and the large pixels may have a size of about 200×200 μm$^2$. The small active area array of structures may be used to enhance light extraction and reduce divergence. The small features which can be easily defined (lithographic limit) means that high aspect ratio devices can be fabricated using the present invention enhancing useful light extraction and/or reducing the divergence of the resultant emitted beam.

The structures of the present invention may also be used to provide an effective variable (graded) p-contact resistance (Process 1, 2 or 3). For example, using lithographic techniques to form 3-D patterning of the resist e.g. greyscale patterning or resist reflow, it is possible to introduce an effective varying resistance profile across the p-GaN. Such designs can be used for example to form a p-GaN layer with a non-linear profile such as a Gaussian resistance profile. This can then increase power in comparison to a small uniformly defined pixel (improve device performance by reducing efficiency droop) and also optimise the beam profile for coupling of the light to an external systems using monolithic or hybrid integrated or external lenses. This variable contact resistance also provides a route to achieve a beneficial 'gain guiding' effect created by carrier induced refractive index control in the InGaN light emitting region. In effect by amplifying the centre parts more than the wings of the spatial profile, the beam width can be reduced, and this effect may be strong enough to counteract diffraction.

The present invention may also be a crucial fabrication step used to form Resonant Cavity LEDs (RCLEDs) fabricated from GaN/InGaN or AlGaN type material. RCLED devices require high quality multilayer mirror structures to be deposited onto small LED devices that have a well-defined emitting aperture formed by restricting the current flow into a small, pixel sized channel. The prior art describes depositing extra current blocking layers that are electrically insulating e.g. silicon dioxide to form this current channeling aperture. The effect of this is a non-planar topology on the surface of the RCLED structure which causes problems forming a high quality multilayer mirror stack, especially as the pixel dimensions are reduced.

Forming an aperture using the fabrication process of the present invention provides numerous process and performance advantages over the prior art. The aperture can be well controlled and designed to have a planar contact layer thus enabling the aperture to be smaller in size than the reflective coating layer deposited on top of the contact and thus providing a uniform reflective coating over the aperture (this avoids step coverage issues at the aperture as used in standard techniques). If required the size of the aperture can be less than 10 μm. For example, a GaN modified planar region can be fabricated to a high resolution and thus create a well-defined cavity diameter (aperture). The modified sections that block vertical electrical currents are well defined and on a planar region thus channelling the current across the RCLED cavity (Process 2 is the preferred embodiment as it enables lateral current to be carried from the P contact and channeled across the p-n junction at the ohmic contact region). This removes the need to either create a current blocking layer in the epilayers or physical etching of the stack or forming an aperture using a dielectric material such as $SiO_2$ to channel the current. The planar nature of the ohmic and electrically modified sections enhances the performance and possibly the device lifetime as there is no physical etching of the mesa (sidewall losses). Having a planar section also has a significant advantage where the reflector (metal and/or Distributed Bragg reflector (DBR) stack) are formed on a smooth surface. This can be critical in achieving a well-controlled deposition for the reflector using evaporation/sputtering/etc.

In a similar manner, the present invention may also be used to form Vertical Cavity Surface Emitting Lasers (VC-SELs). This fabrication process in the case of GaN VCSELs, p-GaN modification provides a route to maintaining a low-loss planar high reflectivity DBR mirror above the p-GaN material whilst allowing the current to be precisely channeled into the required active region.

According to a fourth aspect of the present invention there is provided modified GaN structures formed by a process comprising the following steps:
  depositing a first spreading layer on top of a p-layer;
  depositing a mask feature onto the first spreading layer to form a layered structure wherein some areas of the spreading layer are protected by the mask feature and others are not;
  then exposing the layered structure to an etch (plasma or dry) to remove the first spreading layer from the areas not protected by the mask;
  followed by removing the mask layer from the structure;
  then exposing the layered structure to a plasma treatment;
  then annealing the plasma treated layered structure;
  wherein the areas not protected by the mask feature are exposed to the plasma treatment and form regions of modified p-GaN that are non-conducting to vertical currents due to the plasma and annealing process and the areas protected by the mask are shielded from the plasma treatment and after annealing are conductive at the layers protected by the mask feature.

According to a fifth aspect of the present invention there is provided a semiconductor fabrication process comprising the following steps:
  depositing a mask feature onto the p-GaN layer wherein some areas of the p-GaN are protected by the mask feature and others are not;
  then exposing the structure to a plasma treatment;
  followed by removing the mask layer from the structure
  depositing a first spreading layer on top of the plasma treated p-layer;
  then annealing the plasma treated layered structure;
  wherein the areas not protected by the mask feature are exposed to the plasma treatment and form regions of modified p-GaN that are non-conducting to vertical currents due to the plasma and annealing process and the areas protected by the mask are shielded from the plasma treatment and after annealing form conductive contact at the layers protected by the mask feature. As a further feature the unprotected layers whilst remaining non-conducting to vertical currents through the GaN layer permits lateral current conduction across the spreading layer so that the drive current is channeled efficiently to the protected conductive region.

According to a sixth aspect of the present invention there is provided a semiconductor fabrication process comprising the following steps:
  depositing a first spreading layer less than or equal to 20 nm in thickness on top of a p-layer;
  depositing a mask feature onto the first spreading layer to form a layered structure wherein some areas of the spreading layer are protected by the mask feature and others are not;
  then exposing the layered structure to a plasma treatment;
  then exposing the structure to a plasma treatment;
  followed by removing the mask layer from the structure
  then annealing the plasma treated layered structure;
  wherein the areas not protected by the mask feature are exposed to the plasma treatment and form regions of modified p-GaN that are non-conducting to vertical currents due to the plasma and annealing process and the areas protected by the mask are shielded from the plasma treatment and after annealing form conductive contact at the layers protected by the mask feature.

As a further feature the unprotected layers whilst remaining non-conducting to vertical currents through the GaN layer also permit reduced lateral current conduction (parasitic) across the associated spreading layer.

The modified structures may be as defined in the first aspect.

The conductive contact may be an ohmic contact at the layers protected by the mask feature.

The structures formed may include any of the following: structures with variable (graded) p-contact resistance; Resonant Cavity LEDs (RCLEDs) and Vertical Cavity Surface Emitting Lasers (VCSELs).

The p-contact modification process can also be used to form areas of modified p-GaN that blocks current through the GaN layers in a vertical direction with reduced conductivity to lateral currents. As an example so that bond-pads and/or metal tracks (or interconnects) can be placed on top of the modified surface. Such a layout enables for bond-pads to be formed with a reduced thickness of passivation e.g. $SiO_2$ layer of 20 nm beneath the bond-pad. It provides the ability to easily form p and n bond-pads on the same layer so as to reduce the unwanted effect of having disparate heights when flip-chip bonding or wire-bonding devices. For individual control of the pixels it is necessary to remove the thin spreading material between pixels for Process 2 and 5 owing to the lateral spreading current. Localised n contact regions can also be formed with reduced passivation provided at the etched features thus permitting contact to the n-GaN material. This can dramatically reduce the amount of material to be etched and also provide a means to distribute n contacts to optimise device performance. This also could form a simpler overall fabrication process.

BRIEF DESCRIPTION OF THE DRAWINGS

Embodiments of the present invention will now be described, by way of example only, with reference to the accompanying drawings in which:

FIGS. 1a, 1b and 1c are representations of the process (Process 1) according to an embodiment of the present invention where there is a plasma treatment followed by an annealing treatment;

FIGS. 1d, 1e and 1f are representations of the process (Process 2) according to an embodiment of the present invention where there is a plasma treatment followed by an annealing treatment;

FIGS. 1g and 1h are representations of the process (Process 3) according to an embodiment of the present invention where there is a plasma treatment followed by an annealing treatment;

FIG. 7b (i) represents a pixel with an emission area defined by the current modification process (Process 1, 2 or 3) which is smaller than the etched mesa and with sloped sidewalls defined by etching;

FIG. 7b (ii) represents an SEM of an array of larger pixels where the sidewall is controlled to about 40°;

FIG. 7d represents a pixel with a non-linear gain profile defined by the p-GaN modification Process 2;

FIG. 7f represents a pixel with a non-linear gain profile defined by the current p-GaN modification Process 2 using an alternative technique (grey-scale mask);

FIGS. 12a-12d are representations of an array of LED pixels: FIG. 12a is the standard process of etching pixels with a common n contact—these structures can be flip-chip bonded to provide individual LED control; FIG. 12b is a schematic of p-GaN modification process to form planar pixels with common n cathode—these structures can be flip-chip bonded to provide individual LED control (for Process 5 it is necessary to remove spreading material between LED pixels); FIG. 12c is the standard process for pixel formation with p-tracks to the side of the pixel with a common n contact—these structures can be wire or flip-chip bonded to provide individual LED control; and FIG. 12d is a schematic of p-GaN modification process to form planar pixels with p-tracks to the side of the pixel and with a common n contact (for Process 5 it is necessary to remove spreading material between LED pixels); and FIG. 13 is a schematic of a device having a p-GaN modification treatment that is localized to the pixel to reduce leakage currents.

BRIEF DESCRIPTION

Figure 2:
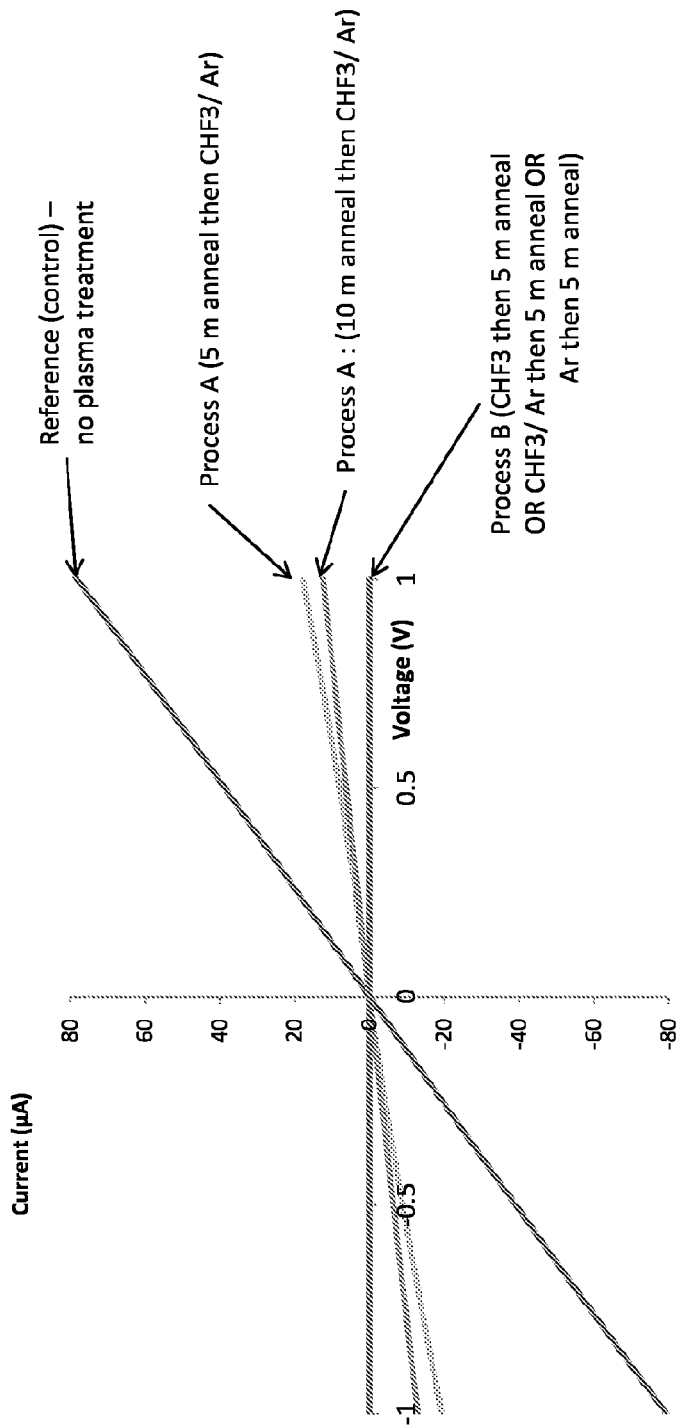
FIG. 2 is a graph of I-V electrical characteristics from the assessment of the contact resistance of transmission line mode (TLM) structures for a range of p-GaN modification processes, including a reference structure.
Figure 3:
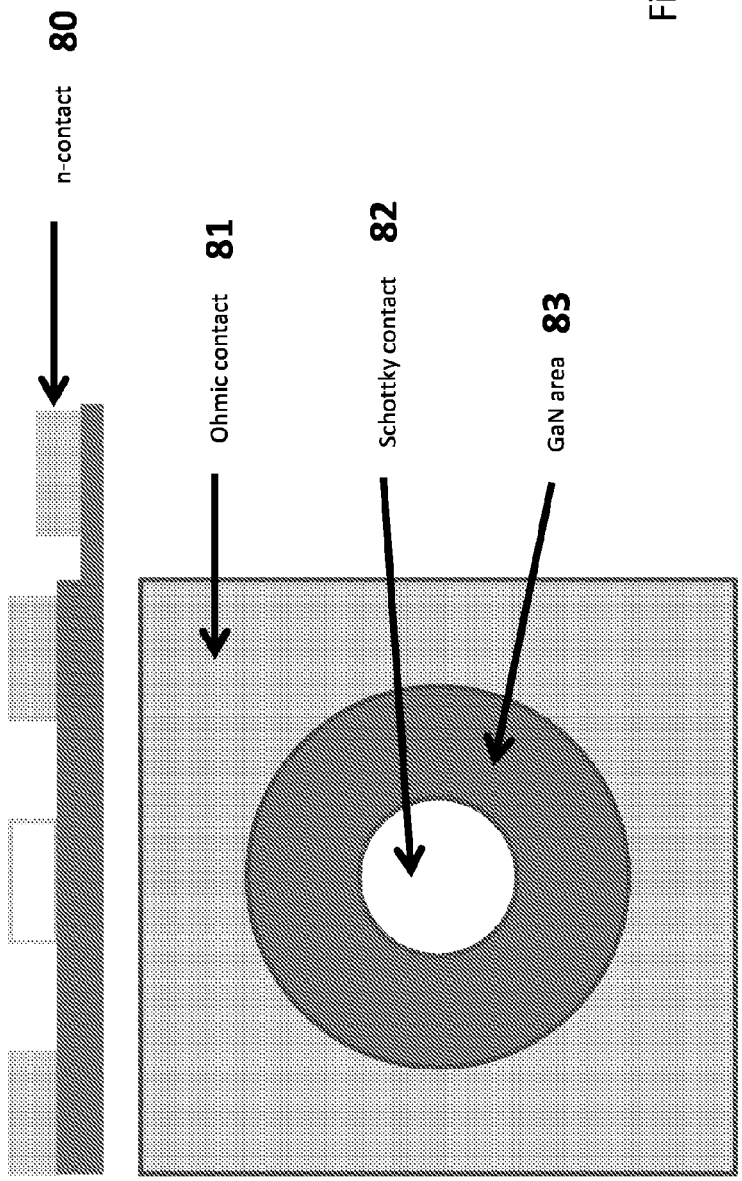
FIG. 3 is a schematic of a test structure used to assess the p-GaN modification process.

Generally speaking, the present invention resides in the provision of providing improved device performance and fabrication techniques for semiconductors e.g. GaN semiconductors.

Although plasma treatment is known to reduce LED performance an important distinction is the ability and process to selectively modify p-GaN. The present invention focusses on a post-anneal process for forming LED structures which has been found to be critically important for being able to simultaneously form conductive sections and sections which are non-conductive to vertical currents through the p-GaN. In this present plasma and annealing processes described herein (Process 1, 2 and 3) have been developed which enable ohmic and non-conducting to vertical current regions to be formed simultaneously. In particular, the ability to form modified non-conducting to vertical current regions using these processes is innovative and offer many advantages for processing and device formation. The process of the present invention with its ability to form planar structures with high resolution offers many advantages for a range of devices and applications.

In essence the present invention provides three processes to provide selective deactivation of p-GaN. Process 1 generally can be described as follows:
- a first spreading layer is deposited on top of a GaN p layer e.g. Ni/Au
- a patterned mask feature (e.g. photoresist) is then deposited on the spreading layer
- then exposing the layered structure to an etch (plasma or dry) to remove the first spreading layer from the areas not protected by the mask
- said structure is then exposed to a plasma such as $CHF_3$
- the removal of a patterned feature may then be performed
- then annealing of the structure to form regions with modified electrical characteristics in the areas exposed to plasma, whilst retaining conductive e.g. ohmic contact at the layers protected by the mask Process 2 generally can be described as follows:
- a patterned mask feature (e.g. photoresist) is deposited on the p-GaN layer
- the structure is then exposed to a plasma such as $CHF_3$
- the removal of a patterned feature may then be performed
- a first spreading layer is deposited on top of a GaN p layer e.g. Ni/Au
- then annealing of the structure to form regions with modified electrical characteristics in the areas exposed to plasma and anneal, whilst retaining conductive e.g. ohmic contact at the layers protected by the mask Process 3 generally can be described as follows:
- a first spreading layer less than or equal to 5 um in thickness is deposited on top of a GaN p layer e.g. Ni/Au
- a patterned mask feature (e.g. photoresist) is then deposited on the spreading layer
- said structure is then exposed to a plasma such as $CHF_3$
- the removal of a patterned feature may then be performed
- then annealing of the structure to form regions with modified electrical characteristics in the areas exposed to plasma and anneal, whilst retaining conductive e.g. ohmic contact at the layers protected by the mask It should be noted that the process sequence for Process 1, 2 and 3 of the present invention is extremely important for being able to form planar conductive and vertical current blocking regions of the upper p GaN layer. This specific processing sequence for forming LED structures is not known in the art. The formation of conductive regions and regions with modified electrical characteristics that behave as insulating regions to vertical currents using these techniques is not known and offers a great deal of versatility in processing and device structures and performance.

FIGS. 1a, 1b and 1c are representations of Process 1 of the present invention. FIG. 1a shows plasma exposure 12 being used to provide treatment to a structure generally designated 10. FIG. 1a shows that there is a GaN p layer 14, a first spreading layer 16 located on top of the GaN p layer 14; and a patterned mask feature (e.g. photoresist) 18.

FIG. 1b shows that Area 1 on the left- and right-hand side is exposed to a plasma or wet etch which results in a spreading layer 20 in these areas being etched. FIG. 1b shows that Area 1 on the left- and right-hand side is then exposed to the plasma 12 which results in the p layer 14 in these areas being partially converted to n-type GaN. The plasma may, for example, be $CHF_3$. These converted areas now become non-conducting to vertical current and are represented in FIG. 1c as converted areas 22, 24. The patterned mask 18 is then removed.

FIG. 1c is representative of the subsequent annealing of the whole structure 10 in a furnace to a temperature of about 500° C. or alternatively the structure 10 is subjected to Rapid Thermal Annealing (RTA) for a time of about 300 sec and to a temperature of about 500° C. This results in the converted areas 22,24 becoming blocking to vertical electrical currents and the areas which were protected by the mask 18 forming conductive contact e.g. ohmic contacts.

FIGS. 1d, 1e and 1f are representations of Process 2 of the present invention. FIG. 1d shows plasma exposure 32 being used to provide treatment to a structure generally designated 30. FIG. 1d shows that there is a GaN p layer 34; and a patterned mask feature (e.g. photoresist) 36.

FIG. 1d shows that Area 1 on the left- and right-hand side is exposed to the plasma 32 which results in the p layer 34 in these areas being partially converted to n-type GaN. The plasma may, for example, be $CHF_3$. FIG. 1f shows a first spreading layer 36 located on top of the GaN p converted layer 38 and GaN p protected layer 40.

FIG. 1f is representative of the subsequent annealing of the whole structure 30 in a furnace to a temperature of about 500° C. or alternatively the structure 30 is subjected to Rapid Thermal Annealing (RTA) for a time of about 300 sec and to a temperature of about 500° C. This results in the converted areas 38 becoming blocking to vertical electrical currents and the areas which were protected by the mask 36 forming conductive contact e.g. ohmic contacts 40.

FIG. 1g shows plasma exposure 64 being used to provide treatment to a structure generally designated 50. FIG. 1g shows that there is a GaN p layer 66, a first spreading layer 68 of 20 nm or less located on top of the GaN p layer 66; and a patterned mask feature (e.g. photoresist) 54.

FIG. 1g shows that Area 1 on the left- and right-hand side is exposed to the plasma 64 which results in the p layer 66 in these areas being converted. The plasma may, for example, be $CHF_3$. These converted areas are non-conductive to vertical current and are represented in FIG. 1g as converted areas 58, 60.

As shown in FIGS. 1g and 1h, in Area 2, the integrity of the p layer 66 in the area under the patterned mask feature (e.g. photoresist) 54 is retained.

There is then subsequent annealing of the whole structure 50 in a furnace to a temperature of about 500° C. or alternatively the structure 50 is subjected to Rapid Thermal Annealing (RTA) for a time of 300 sec and to a temperature of about 500° C. This results in the structure 62 being annealed to have vertically non-conducting 58,60 and conductive 62 areas on the planar structure.

It is this specific sequence of irradiating with plasma and then annealing to form LED structures which is not known in the art.

In Area 1 of process 1, 2 and 3, the p-GaN 66 is converted to provide an n-type behaving GaN planar layer which blocks vertical current flowing into the non-converted p-GaN below, irrespective of the top layer. In Area 2 the spreading layer 68 is diffused into p GaN 66 to provide ohmic contact.

FIG. 2 is an electrical I-V graph for a number of TLM structures which have the same device structure. In these particular arrangements there is a reference device: p-GaN contact spreading metal deposition with subsequent annealing of the spreading metal to form ohmic contacts in RTA; no exposure to plasma. A subsequent arrangement (Process A) is based on p-GaN spreading metal deposition followed by RTA annealing with subsequent plasma processing of the exposed p-GaN. In the final and optimum solution (Process 13) p-GaN contact spreading metal deposition is followed by plasma processing of the exposed p-GaN and subsequent RTA annealing.

As measured in FIG. 2, the reference (standard processing with no p-GaN plasma exposure) TLM structure resistance was measured to be ~13 kΩ. In comparison, for Process A this increased the apparent TLM resistance to 50 kΩ (a factor of ~4) even for extended plasma exposures of 600 sec. Process 13 had a dramatic effect on TLM measured resistance of the p-GaN, increasing to ~70 MΩ (a factor of ~5,400) to effectively provide highly resistive material to current flowing between converted and non-converted p-GaN owing to the existence of a bandgap between the n- and p-type GaN material thus present. This capability was demonstrated for different plasma gases: $CHF_3$; $CHF_3/Ar$ and Ar plasmas, highlighting the versatility of the process.

An investigation into the nature of the p-GaN modification process is summarized in FIGS. 3-6. The test structure (FIG. 3) is based on a simple Schottky type diode structure on the p-GaN comprising a Schottky type central contact 82 formed from a TiAu alloy and an ohmic type outer contact 81 from annealed NiAu with the addition of an etched contact to the underlying n-GaN at the edge of the device 80. Multiple test structures are located on one die permitting current-voltage (IV) measurements to be performed between adjacent devices. Multiple variations of the same test structure were fabricated:

C1—control test structure—basic Schottky device with no plasma based GaN modification treatment. The Schottky contact 82 is thus made to non-converted p-GaN.

A1,A2—GaN modified test samples fabricated by exposing all the GaN not protected by the outer ohmic contact (83 and below 82) to the converting plasma treatment. n-contact etch is then formed after the GaN treatment hence the n-etch is not exposed to the plasma converting effect. The Schottky contact 82 is on plasma treated converted p-GaN.

A3—GaN modified test sample fabricated by forming the n-etch and n-contact then exposing all the GaN not protected by the outer ohmic contact (83 and below 82) to the converting plasma treatment hence the n-etch is exposed to the plasma converting effect. The Schottky contact 82 is on plasma treated converted p-GaN.

Figure 4:
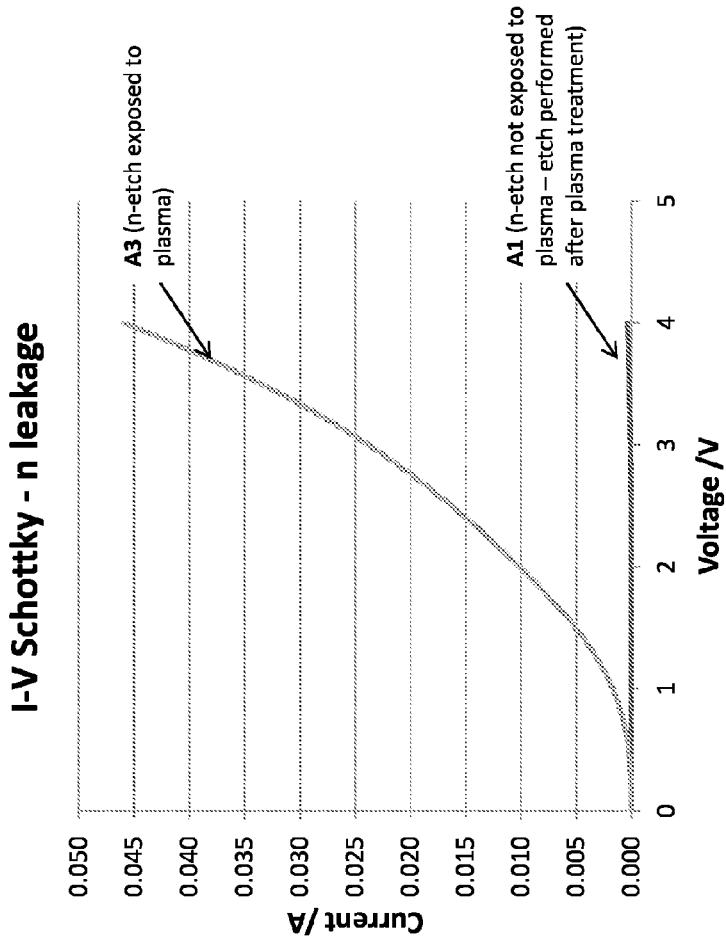
FIG. 4 is a graph of I-V electrical characteristics from the assessment of the leakage from the Schottky contact to the n-contact of the test structure for process conditions in which the n-etch is not exposed to the plasma (A1) and is exposed to the plasma (A3)

A brief summary of the differing characteristics of the 3 variations of the test structure are presented in FIGS. 4-6.

FIG. 4 illustrates the importance of preventing an exposure of the n-etch region used to form an electrical contact with the underlying n-GaN to the p-GaN converting plasma exposure. Here, IV measurements are performed between the central Schottky contact on the treated p-GaN and the n-contact. Device A3 with the plasma affected etch clearly demonstrates a leakage path between the Schottky contact and the underlying n-GaN that does not involve the GaN p-n junction (leakage current is below the ~2.5V bandgap of the p-n junction). Conversely, device A1 which involved forming the n-etch after plasma treatment and hence the n-etch was not exposed to the p-GaN converting plasma exposure does not exhibit significant leakage below the p-n junction bandgap. This figure suggests a leakage path is formed on treating an n-contact etch to the plasma exposure this is to be avoided to ensure efficient device fabrication and in particular unwanted current leakage.

Figure 5B:
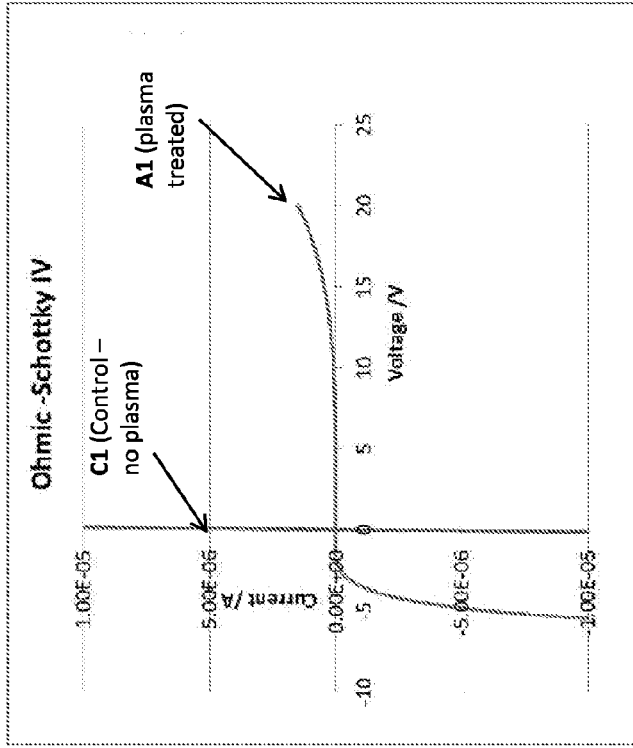
FIG. 5 are I-V electrical characteristic plots showing the assessment of the Schottky junction formed on a p-GaN modified device (A1) compared with a non-modified control device (C1)
Figure 5A:
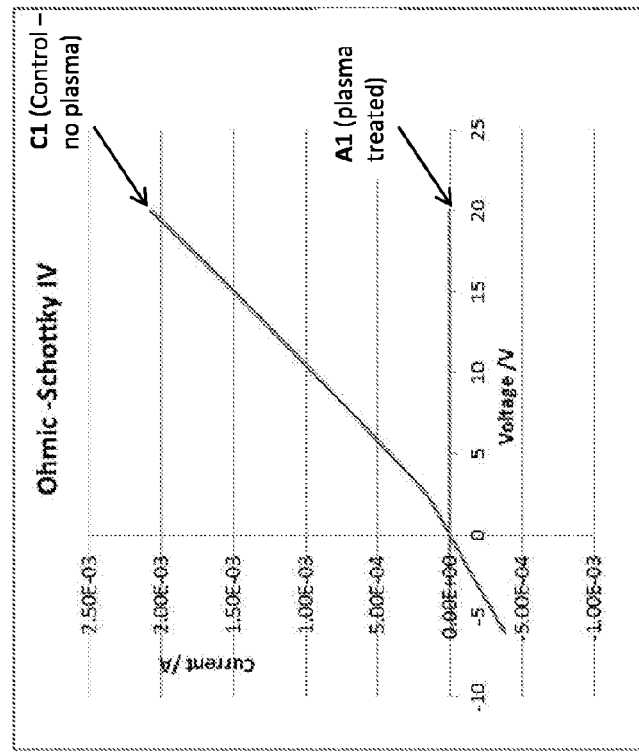

FIG. 5 contrasts the performance of the Schottky diode formed on the untreated p-GaN control device (C1) with the Schottky test diode on the plasma converted p-GaN (A1). FIGS. 5a and 5b are identical apart from the vertical (I) scale. The control device (C1) shows practically no bandgap to forward or reverse biased applied potentials. This is typical of Schottky contacts formed on p-GaN that possesses many defect assisted tunneling current leakage paths. In contrast, the plasma treated device (A1) exhibits a modest 3V bandgap in reverse bias and a considerable 15V bandgap in forward bias. Additionally, the total series resistance of the control device in forward bias (beyond the bandgap voltage) is ~8 k ohm, whereas the total series resistance for the plasma treated device is >80 k ohm. The effective polarity of what is considered forward and reversed biased also appears to be reversed between untreated and treated devices. This result clearly demonstrates that the plasma treatment has caused a fundamental change to the nature of the p-GaN and while the conductivity of the p-GaN is reduced on plasma treatment, it is not totally insulating in nature.

Figure 6A:
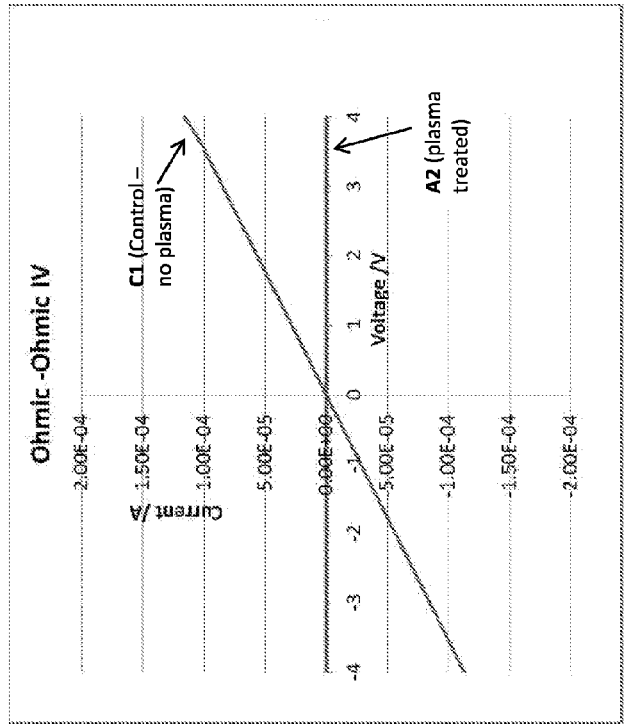
FIG. 6 are I-V electrical characteristic plots showing how the current flowing between adjacent ohmic contacts on adjacent test devices differs between a non-modified control device (C1) with a plasma treated p-GaN modified device (A2)
Figure 6B:
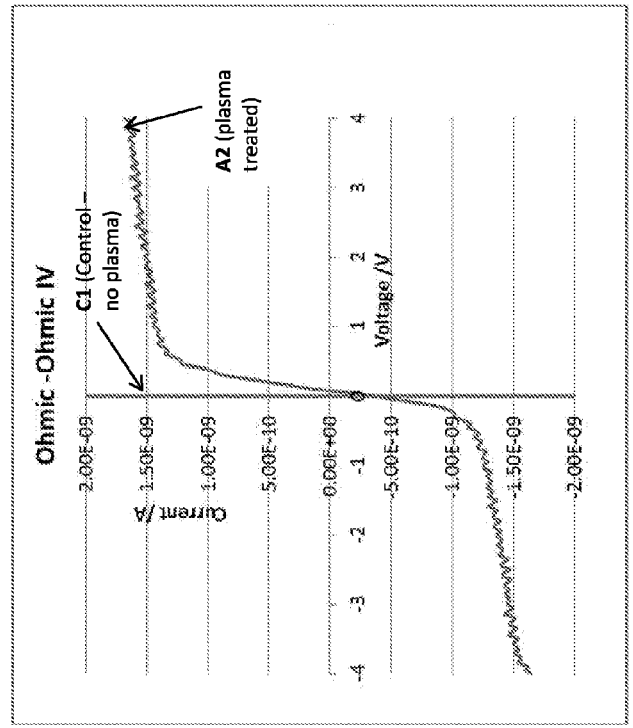

FIG. 6, which involves probing the outer ohmic contacts on two adjacent test structures on plasma treated (A2) and untreated control (C1) devices clearly demonstrates the good electrical isolation afforded between untreated p-GaN areas by treating the p-GaN region between the untreated areas with plasma. FIGS. 6a and 6b are identical apart from the change in the vertical (I) scale. The current voltage plots of two ohmic contacts should be linear for all voltages and obey Ohm's law. Clearly for the control device C1, this is the case in FIG. 6b and a total series resistance is ~35 kilohm. For the device where all the p-GaN between the ohmic contacts has been converted by undergoing plasma treatment, the IV plot follows a linear relationship for small voltages <+/−0.2V (FIG. 6a) with a total effective series resistance of 25 megohm. This conductivity however saturates to ~1.5 nA at >~+/−0.5V, hence for large voltages, the effective series resistance appears to be much higher than 25 megaohm, e.g. at 4V, the apparent series resistance is 2.4 gigaohm. This result indicates that whilst the treated p-GaN might appear to behave as a simple insulator, the reality is somewhat more complicated than this where the isolation afforded by the p-GaN treatment is a result of an interplay between the converted p-GaN and the untreated p-GaN and involves p-n bandgaps and conductive path channel narrowing.

The conclusion from the results presented here, particularly FIG. 5, is that the p-GaN undergoes a transformation on plasma exposure to that of a poorly behaving n-GaN.

Using the process of the present invention it is possible to form pixels of varying size using a standard lithographic process such as less than 10 μm and even less than 2 μm.

The present invention has numerous advantages for a range of structures. A non-exhaustive list is provided below to demonstrate the capabilities of the present invention:

1. Small Planar Pixel

To manufacture pixels less than 10 μm diameter is challenging. This becomes more challenging when forming LEDs using lithography, metal deposition, plasma etch, passivation, etc.

The technique of the present invention is a simplified process and provides a means to form pixels on a planar surface (removing the topographical challenges of standard techniques) of less than 10 μm.

Figure 7A:
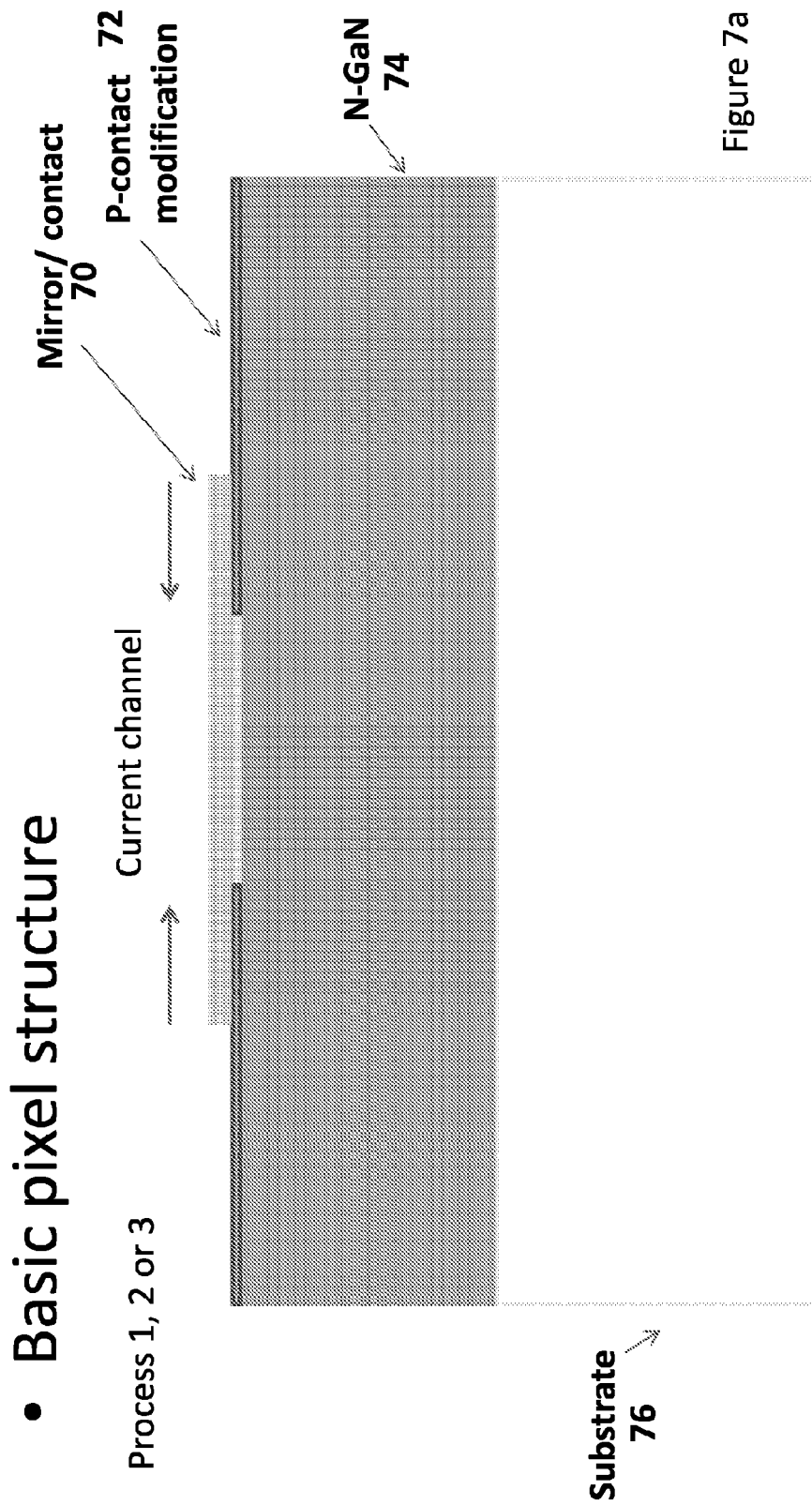
FIG. 7a is a representation of a planar pixel formed using p-Gan modification process.

The process of the present invention also does not rely on etched sidewalls that introduce loss mechanisms e.g. increased non-radiative carrier recombination at etched features of the active p-n junction. This is detailed in FIG. 7a. FIG. 7a shows a mirror 70, a p-contact modification area 72, n-GaN 74 and a substrate 76. In particular, FIG. 7a shows p-GaN modification is employed to lithographically form a pixel. Consequently, the pixel or pattern to be formed using Process 1, 2 or 3 is dependent on the mask design. The flexibility of this technique thus means that structures can be formed which are only limited by the resolution of the lithography process and as such are well suited to forming pixels which can be smaller than 10 μm, The process of the present invention is also not limited by p mesa formation using industry standard etching techniques and consequently a route to less than 2 μm diameter micro LED structures is therefore possible.

2. Small Active Area in Larger Pixel

There are a number of integrated structures which can enhance light extraction and reduce divergence by having a smaller electrically activated conductive area in a larger lens type reflector e.g. spherical, parabolic or sloped sidewall.

The ability to form a p-GaN layer with non-vertically conducting behaviour using the plasma modification process (Process 1, 2 or 3) means that a planar metal can be easily patterned on the top p layer. This is detailed in FIG. 7b (i), where p-contact modification is employed to define a localised conductive contact e.g. an ohmic contact. There is shown n-GaN 150 and a mirror 152. An etched mesa is then formed which has the latitude to be larger than the conductive contact area. Furthermore, the etched sidewall can be controlled to provide a straight, sloped, spherical or parabolic sidewall. FIG. 7b (ii) illustrates a pixel with ~40° mesa sidewall angle. This illustrates the ability to re-direct the isotropic light generated through sidewall interaction, which becomes more pronounced the smaller the mesa. Consequently, the pixel or pattern to be formed is dependent on the mask design.

As the etched sloped sidewalls are located away from the active region where both carriers (electrons and holes) are present, non-radiative carrier recombination at the sidewalls of the active p-n junction region is reduced/eliminated.

The small features which can be easily defined (lithographic limit) means that high aspect ratio devices can be fabricated using the present invention enhancing useful light extraction and reducing the divergence of the resultant emitted beam.

3. Variable (Graded) p-Contact Resistance

Using lithographic techniques to form 3-D patterning of the resist e.g. greyscale patterning or resist reflow. It is possible to introduce an effective varying resistance profile across the p-contact.

Figure 7C:
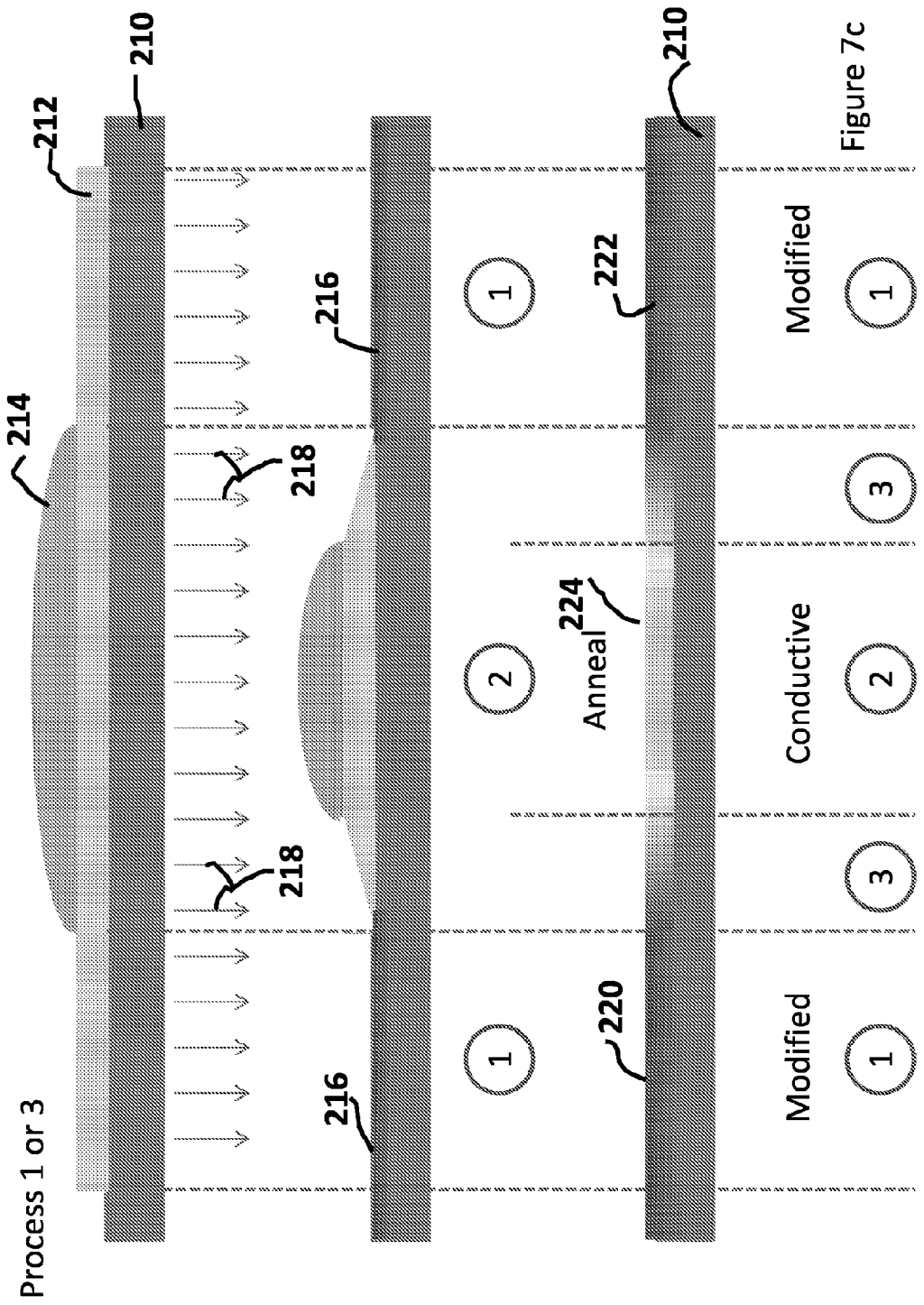
FIG. 7c represents a pixel with a non-linear gain profile defined by the p-GaN modification Process 1 or 3.

Such designs can be used for example to form a p-contact with a non-uniform profile such as a Gaussian resistance profile. This is illustrated in FIG. 7c for Process 1 or 3. The top diagram of FIG. 7c shows a GaN p layer 210, a first spreading layer 212 located on top of the GaN p layer 210; and a patterned mask feature (e.g. photoresist) 214. As shown in the second diagram of FIG. 7c, Area 1 on the left- and right-hand side is exposed to a dry or wet etch 216 to remove the spreading material 212. Area 1 on the left- and right-hand side is then exposed to the plasma 218 which results in the p layer 210 in these areas being modified.

The plasma may, for example, be $CHF_3$. Area 224 is annealed. The modified areas behave highly resistive to vertical currents and are represented as modified areas 220,222.

In a similar manner FIG. 7d illustrates the technique for Process 2. The top diagram of FIG. 7d shows a GaN p layer 310, and a patterned mask feature (e.g. photoresist) 314. As shown in the first diagram of FIG. 7d, Area 1 on the left- and right-hand side is exposed to the plasma 316 which results in the p layer 310 in these areas being modified. The plasma may, for example, be $CHF_3$. The second diagram illustrates a first spreading layer 318 located on top of the GaN p layer 310; Area 320 is annealed. The modified areas behave highly resistive to vertical currents and are represented as modified areas 322,324.

In the embodiment shown in FIGS. 7c and 7d, a resist reflow technique is used to vary the profile of the mask 214, 314 e.g. photoresist. Consequently, after p-GaN modification (plasma and annealing) the effective overall contact resistance across the pixel is varied in a controlled manner such that more light is generated in the regions with the lowest contact resistance.

Figure 7E:
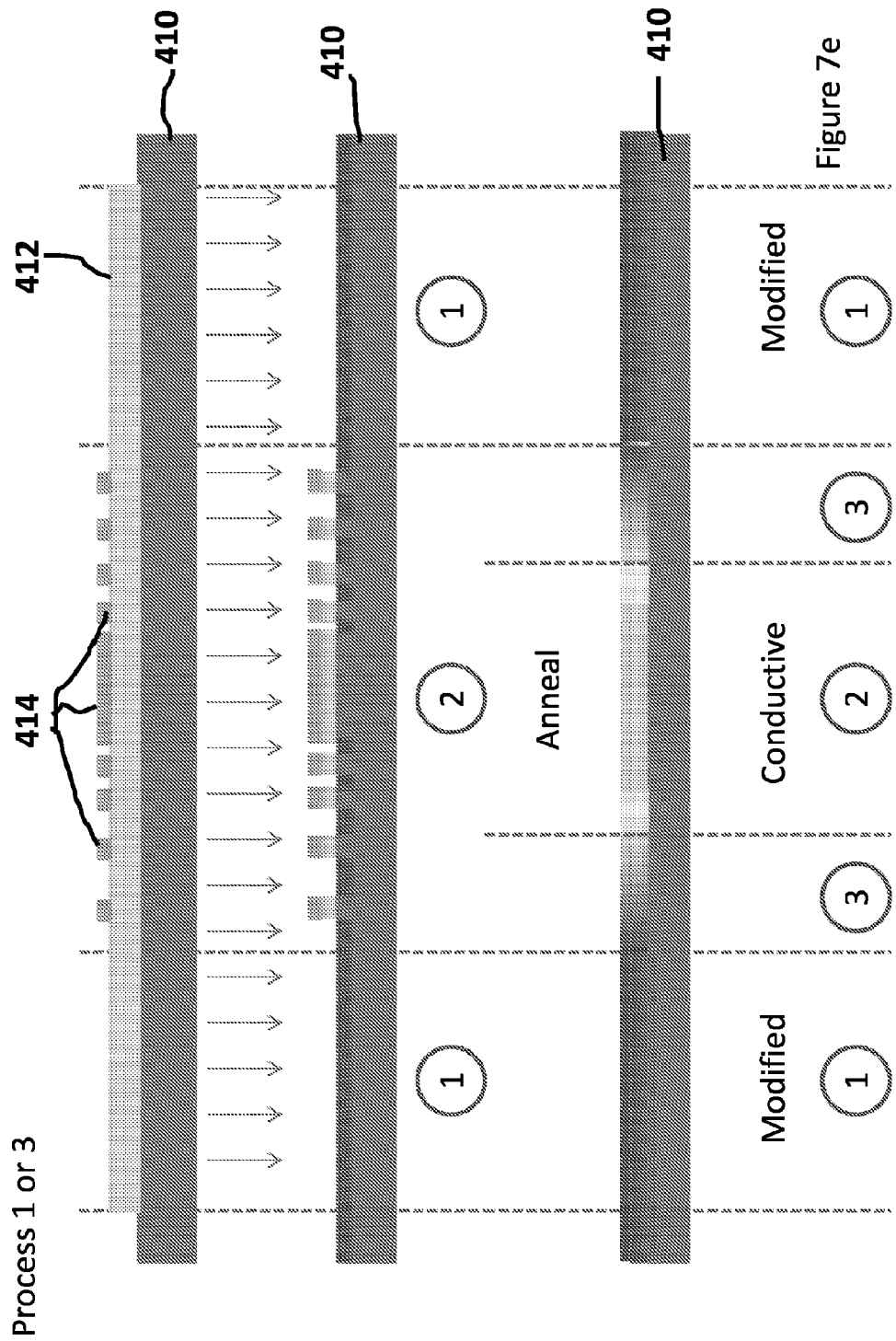
FIG. 7e represents a pixel with a non-linear gain profile defined by the current p-GaN modification Process 1 or 3 using an alternative technique (grey-scale mask)

An alternative procedure for Process 1 and 3, is shown in FIG. 7e would be to use a patterning approach similar to a greyscale image (dithering) to create a graded resistance profile 414. Similar to before there is a GaN p layer 410 and a first spreading layer 412 located on top of the GaN p layer 410.

An alternative procedure for Process 2, is shown in FIG. 7f would be to use a patterning approach similar to a greyscale image (dithering) to create a graded resistance profile 514. Similar to before there is a GaN p layer 510 which is exposed to the plasma and then a first spreading layer 512 located on top of the GaN p layer 510.

This can then improve power in comparison to a small defined pixel and also improve the beam profile. It is well known in the art that coupling of the near-field to a lens structure can be improved if the profile is Gaussian or similar.

This also provides a route to a beneficial 'gain guiding' effect created by carrier induced refractive index control in the InGaN light emitting region.

4. Resonant Cavity LEDs (RCLEDs)

There are a number of challenges in forming a RCLED including efficient current channelling, good contact resistance, high performance reflectors, reducing cavity length (improve Q factor) and minimising loss mechanisms.

Forming an aperture using the GaN modification process of the present invention provides numerous process and performance advantages.

Figure 8:
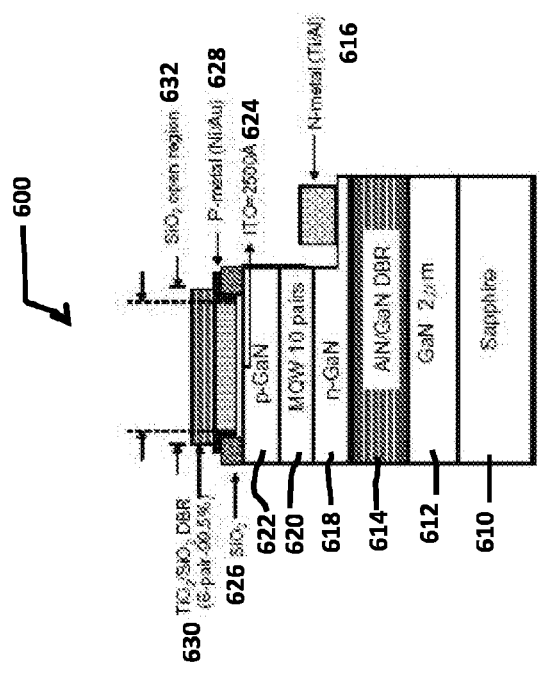
FIG. 8 is a representation of a GaN RCLED made according to a prior art process.

FIG. 8 is a representation of a GaN RCLED generally represented by reference numeral 600 which is made according to a prior art process. As shown in FIG. 8 the structure comprises the following construction: a sapphire layer 610; a GaN layer 612; a AlN/GaN DBR 614; N-metal (Ti/Al) 616; n-GaN 618; ten MQW pairs 620; p-GaN 622; ITO 624; $SiO_2$ 626; p-metal (Ni/Au) 628; $TiO_2/SiO_2$ DBR 630; and $SiO_2$ open region 632.

In FIG. 8 the circular mesas can be formed with diameters of 5 to 600 μm. As shown there are a number of issues with this layout relating to the p contact formation. A serious impairment is that a voltage bias is applied across a portion of the structure which is not within the cavity i.e. a section of the light generated is not aligned to the top mirror structure. This reduces device efficiency. As an example if the reflector is located on top of a 10 μm circular mesa using standard semiconductor processes (lift-off or etching) then to form a p-contact annular ring of 10 μm outer diameter and 6 μm inner diameter would result in only 36% of the light being generated aligned to the top mirror structure. Thus to channel the current so that light is generated within the cavity it is necessary to use an electrically insulating layer such as $SiO_2$ and to have the p-metal to be designed to go over the edge of the $SiO_2$ to make sufficient contact with the ohmic spreading metal to provide lateral current injection. This results in a smaller emission aperture. This also poses a number of processing challenges; it should be evident to those skilled in the art that to align structures of these dimension or similar is demanding. Furthermore, the quality of the mirror has a major effect on device performance. As can be observed in FIG. 8, the dielectric layer will have a typical thickness of 200 nm with a p metal of ~200 nm on top of the dielectric, which will also block light that is generated. Hence, this results in mirrors being deposited over a topographical surface with step height of 400 nm. The thinness of the mirror structure e.g. pairs $SiO_2/ZrO_2$ dielectric pairs (DBR) has the undesired effect of having a step at this interface which impacts on the quality of the mirror, especially for small apertures. By using p-contact modification (preferred embodiment is Process 2 as provides lateral current conductivity but Process 1 or 3 could be utilized) it is possible to have a planar spreading layer with low resistance which then has a transparent conductive oxide to provide connection to the p-metal and where 100% of the light generated is aligned to the top mirror structure. This has the added advantage that the p-contact metal is not aligned to the dielectric aperture and also reduces the step height for DBR coverage. It also means that light is not generated underneath the p-contact metal and as such the mirror step interface is not aligned to the spreading layer with low resistance.

The GaN modified planar region can be fabricated to a high resolution and thus create a well-defined cavity diameter (aperture).

The vertical current blocking sections are well defined and on a planar region thus channeling the current across the RCLED cavity. This removes the need to either create a current blocking layer in the epilayers or using a dielectric layer to channel the current.

The planar nature of the ohmic contacts and modified sections that block vertical currents enhances the performance and possibly the device lifetime as there is no physical etching of the mesa (sidewall losses).

Having a planar section also has a significant advantage where the reflector (metal and/or Distributed Bragg reflector (DBR) stack) are formed on a smooth surface. This can be critical in achieving a well-controlled deposition (evaporation/sputtering/etc.).

5. Vertical Cavity Surface Emitting Lasers (VCSELs)

As above with RCLEDs, VCSELS require current guiding and a low-loss optical cavity arrangement for optimum performance. Much of the points previously addressed for RCLED are the same for VCSEL structures.

In the case of GaN VCSELs, GaN modification provides a route to maintaining a low-loss planar high reflectivity DBR mirror above the p-GaN material whilst allowing the current to be precisely channeled into the required active region (once again Process 2 is the preferred embodiment).

Figure 9:
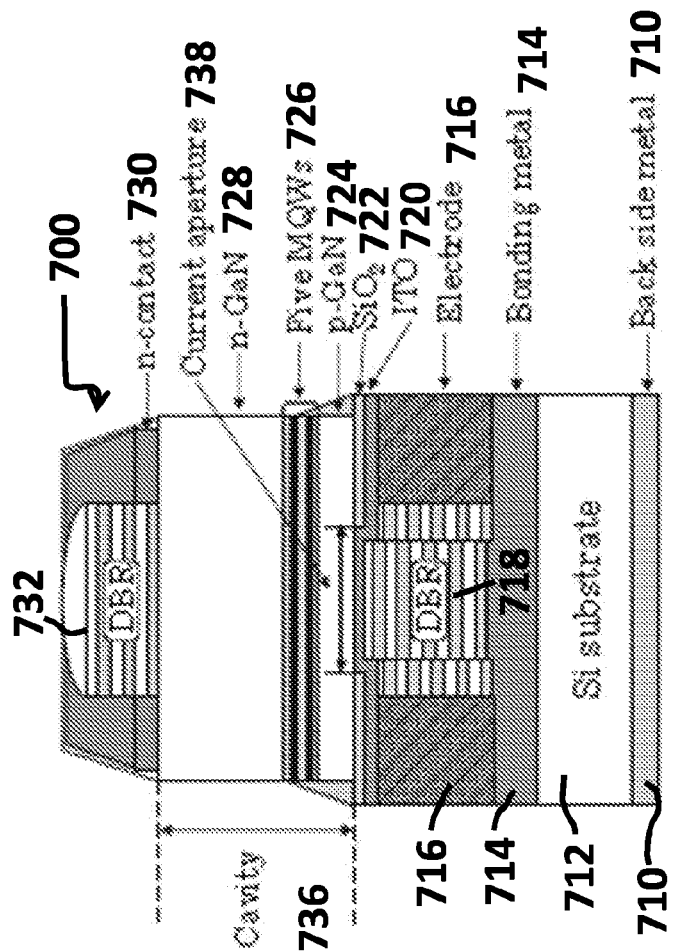
FIG. 9 is representation of a GaN VCSEL made according to a prior art process.

FIG. 9 is a representation of a GaN VCSEL generally represented by reference numeral 700 which is made according to a prior art process. As shown in FIG. 9 the structure 700 comprises: a back side metal 710; a Si substrate 712; a bonding metal 714; electrode 716; a DBR 718; ITO layer 720; $SiO_2$ layer 722; p-GaN 72; five multiple quantum wells (MQWs) 726; a further GaN layer 728; an n-contact 730; and a DBR 732. FIG. 9 also shows the current aperture 738 and cavity 736. The conformal coating of the ITO layer 720 and the DBR structure 718 leads to non-optimal performance.

Commenting on prior art such as shown in FIG. 9, researchers have highlighted the issue of using a dielectric layer to enable current channeling.

Figure 10:
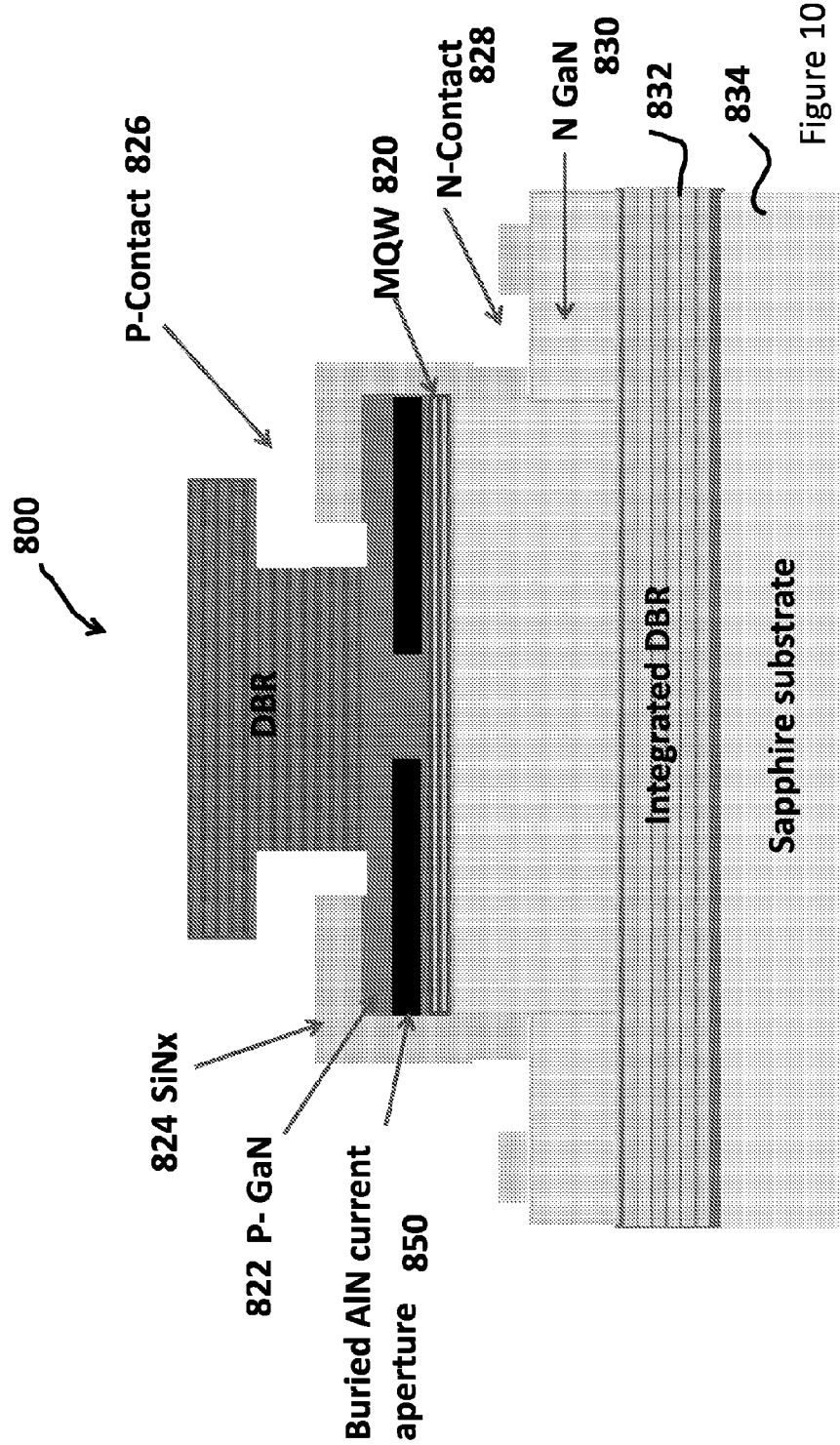
FIG. 10 is a representation of a buried AlN current aperture layer according to the prior art.

Consequently, FIG. 10 is a representation of a process and a VCSEL structure 800 made according to the prior art involving a current blocking layer formed during the growth of the material. FIG. 10 shows the MQWs 820; p-GaN 822 and the $SiN_x$ 824 (e.g. $SiN_2$). It should be noted that in FIG. 6 the AlN layer 850 needs to be grown in-situ. Although this permits the formation of a planar surface for later deposition of a conformal mirror structure, the extra AlN growth layer leads to extra cost and the need to define the structure before growing p-GaN and is incompatible with the use of standard commercially available GaN LED material. There is also shown a p-contact 826; a n-contact 828; N GaN 830; an integrated DBR 832 and a sapphire substrate 834.

Figure 11:
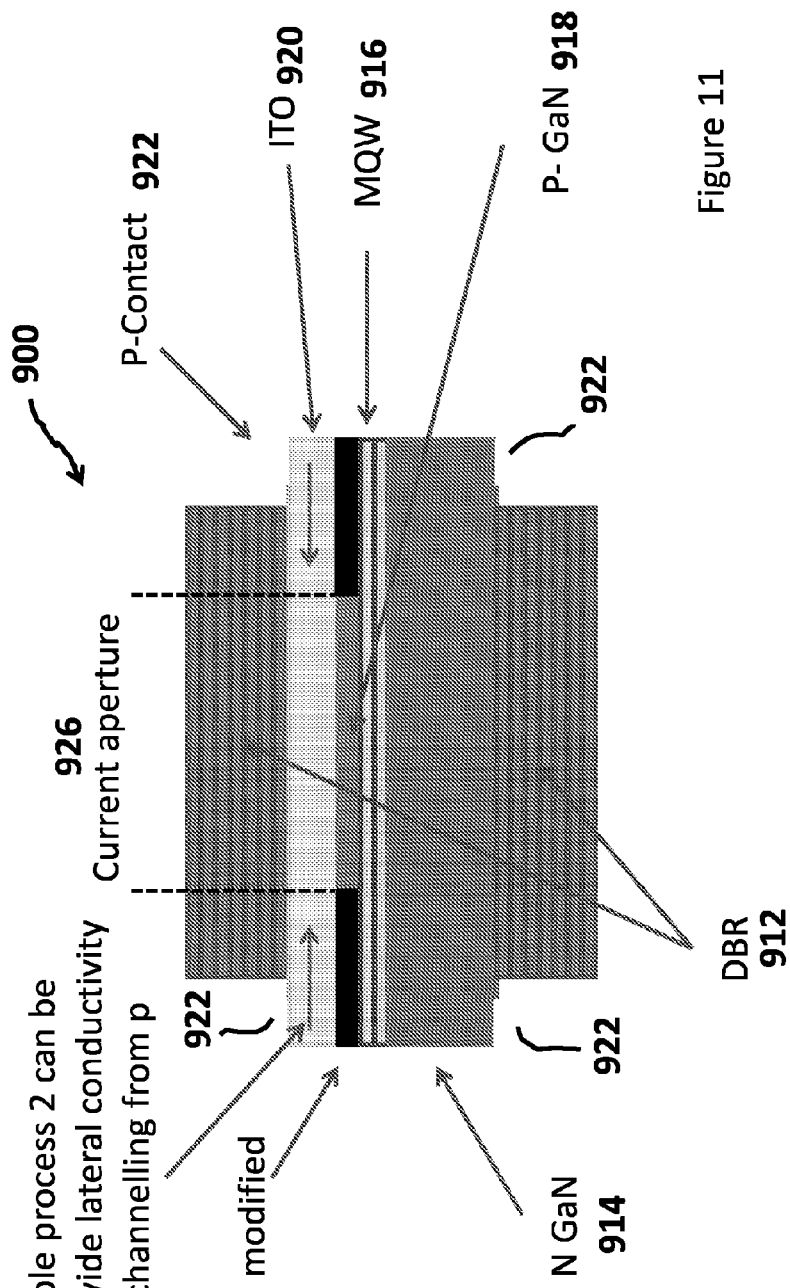
FIG. 11 is a representation of a RCLED structure made according to an embodiment of the present invention (preferred embodiment is Process 2 for lateral spreading current from the p-contact to the conductive contact)

FIG. 11 is a representation of a VCSEL structure 900 made according to the present invention (preferred embodiment is Process 2 as provides lateral current conductivity but Process 1 or 3 could be utilized). The VCSEL structure 900 comprises: a DBR mirror 912; a layer of n-GaN 914; MQW 916; p-GaN current spreading layer 918; an ITO layer 920; and contacts 922. FIG. 11 also shows the current aperture 926 where p-contact modification is employed to lithographically form an aperture.

6. Electrical Isolation of p-GaN

The p-GaN planar modification process can be used to electrically isolate areas of GaN. To provide electrical connection to pixels bond-pads and/or metal tracks (or interconnects) are used. For metal tracks which connect to the p contact or contacts, it is necessary for the track to either sit on top of the same p-GaN section thereby making electrical contact with this p-GaN, or to have an insulating layer below the metal so that it can be placed on a different section of the GaN structure and remain electrically isolated from this different section. Similarly for metal tracks connected to n material these must sit on either the same section of n-GaN material thereby forming an electrical connection with this material, or have an insulating material below the track if placed on a different section of the GaN structure, for instance on the p-GaN. In the event that pixels are addressed individually it is necessary to have a unique p-n junction connection for each pixel. Thus, either the p metal tracks and/or the n metal tracks must be independently connected to each pixel. This means that they must be electrically isolated. For the above structures it is necessary to have tracks and bond-pads (for either wire or flip chip-bonding) which will have disparate heights. Dielectric materials can be placed under tracks for electrical isolation but this involves dielectric deposition, lithography and the need for either lift-off or etching of the insulating regions. It is well known in the art that dielectric insulating layers can suffer from pin-holes or defects and as such cause current leakage or even shorting between the p and n material e.g. when p tracks run over n material.

FIGS. 12a-12d show schematics of the standard and current modification processes for forming pixels that can be connected to the necessary drive circuits.

In FIG. 12a there is shown a standard process for pixel formation with common n electrode. In the cross-section there is shown a mirror/contact 1010, a bump 1012 and a pad 1014.

Figure 12B:
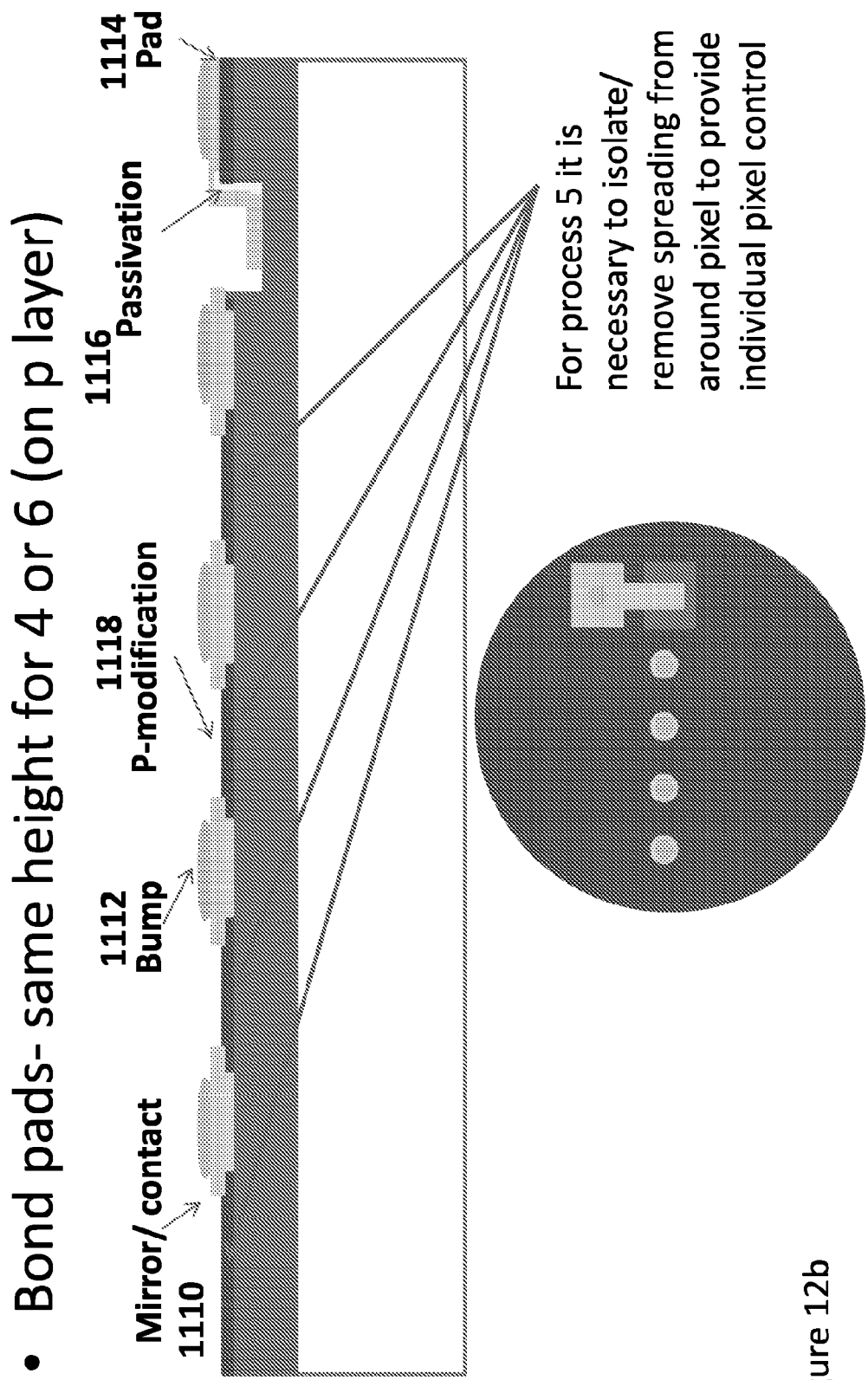

In FIG. 12b there is shown a spread-GaN modification process (Process 4, 5 or 6) to form planar pixels with common n cathode. FIG. 12b shows a mirror/contact 1110, a bump 1112, a pad 1114, passivation 1116 and p-modification 1118. For Process 5 it is necessary to isolate each pixel by removing the spreading material surrounding each pixel to provide individual pixel control.

In FIG. 12c there is shown a standard process for pixel formation and p-tracks to the side of the pixel with common n contact. FIG. 12c shows a mirror/contact 1210, a bump 1212, a pad 1214 and passivation (oxide) 1216.

Figure 12D:
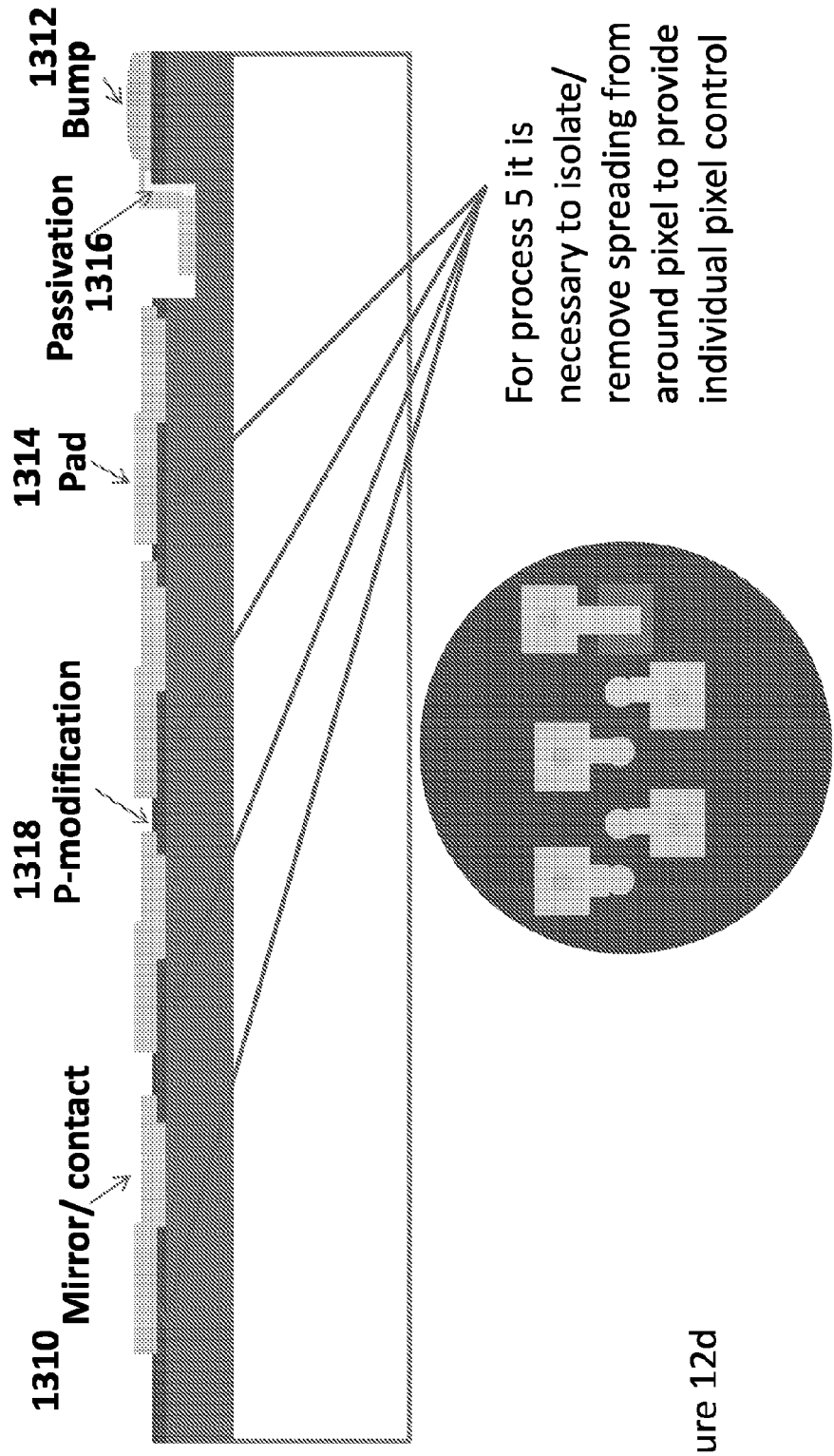

In FIG. 12d there is a p-GaN modification process (Process 4, 5 or 6) to form planar pixels with p-tracks to the side of the pixel and with a common n contact (passivation region e.g. oxide is reduced to e.g. 20 nm as such a small surface). FIG. 12d shows a mirror/contact 1310, a bump 1312, a pad 1314, passivation 1316 and p-modification 1318. For Process 5 it is necessary to isolate each pixel by removing the spreading material surrounding each pixel to provide individual pixel control In FIGS. 12b and 12d planar devices are fabricated on p-GaN material exposed to plasma and thermal anneal to induce a layer that is electrically non-conductive to vertical currents and with reduced lateral conductivity for both track layout and simultaneous pixel formation with conductive contact. Distributed n-contact can be implemented in this process and it should be known to those skilled in the art that the vertical current blocking regions can be placed anywhere required to channel the current to the associated p-n junction.

FIGS. 12b and 12d illustrate a means where using the p-contact modification technique tracks and bond pads can be formed. This can provide a number of advantages; simplified processing, p and n bond pads of the same height and reduction of leakage currents caused by dielectric defects such as pin-holes. Using the simple lithographically defined technique all of the required area is modified apart from those regions where the pixels are to operate. This is a simple process providing layers that are electrically non-conductive to vertical currents and with reduced lateral conductivity where tracks and bond-pads can be formed which are independent (electrically isolated) from each other.

Localised n contact regions are also illustrated in FIGS. 12b and 12d. Passivation is provided at the etched features thus permitting contact to the n-GaN material. This can dramatically reduce the amount of material to be etched and also provide a means to distribute n contacts to optimise device performance. The integrity of the dielectric only need be maintained at the step (in particular the p-n junction), thus the critical length is <1 μm, whilst in a standard process (FIG. 12c) the integrity of the dielectric needs to be maintained for the complete track length. It is not uncommon to have track lengths of 5 mm. In this way a shorter and lower cost fabrication procedure could be realized.

7. Localised p-GaN Modification

FIG. 13 illustrates an alternative embodiment that is preferable for LED structures with reduced leakage currents. In this device, the large mirror/contact (1300) makes contact with the central unmodified p-GaN (1301) coated in spreading metal (1304). A surrounding modified p-GaN region (1302) encircles the central region but is restricted to within a region only slightly larger than the mirror/contact area. Outside of the localized modified p-GaN region, the p-GaN is masked during plasma exposure and remains unmodified by the plasma. Note that no spreading metal should be deposited on this outer unmodified p-GaN.

For an array of such pixels, the plasma modified P—GaN regions (1302) surround each pixel but are separated from the GaN modified regions of adjacent pixels by a region of unmodified p-GaN (1301).

Whilst specific embodiments of the present invention have been described above, it will be appreciated that departures from the described embodiments may still fall within the scope of the present invention. For example, any suitable type of plasma may be used and any form of annealing process may be used.

The invention claimed is:

1. A fabrication process for electronic components, comprising:
    depositing a spreading layer on top of a GaN p-layer;
    depositing a mask feature onto the spreading layer to form a structure with at least part of the structure protected by the mask feature, and at least another part of the structure not protected by the mask feature to form an unprotected mask region; and
    processing the unprotected mask region to form an area with modified electrical characteristics from the GaN p-layer, wherein the processing includes:
        exposing the structure having the mask feature to a plasma treatment;
        removing the mask feature from the structure after exposing the structure to the plasma treatment and prior to annealing the plasma treated structure; and
        annealing the plasma treated structure, wherein;
            the at least other part of the structure not protected by the mask feature is exposed to the plasma treatment and forms a modified p-GaN region that blocks current flow due to the plasma treatment and annealing process; and
            the at least part of the structure protected by the mask is shielded from the plasma treatment and forms a conductive contact after the annealing.

2. The fabrication process for electronic components according to claim 1, wherein the processing of the unprotected mask region causes a reversal in the effective doping of the at least other part of the structure to behave as n-doped GaN.

3. The fabrication process for electronic components according to claim 1, wherein exposing the structure to the plasma treatment, causes the at least other part of the structure protected by the mask feature to be shielded from the plasma treatment and remain unmodified p-GaN.

4. The fabrication process for electronic components according to claim 3, wherein annealing the structure results in the unmodified p-GaN forming the modified p-GaN regions.

5. The fabrication process for electronic components according to claim 1, wherein the processed structure is one of: aRCLED; aVCSEL; astructure with small planar pixels; a semiconductor a structure with patterned p-contacts; and a structure with current blocking regions.

6. The fabrication process according to claim 1, further comprising forming a mesa in the GaN p-layer with a planar active area within the mesa using lithography.

7. The fabrication process for electronic components according to claim 1,
    wherein the spreading layer has a thickness of about 20 nm.

8. The fabrication process according to claim 1, wherein the annealed structure is one of: a RCLED; a VCSEL; a structure with small planar pixels; a semiconductor; a structure with patterned/graded p-contact resistance; and a structure with electrical isolation.

9. The fabrication process according to claim 1, wherein Resonant Cavity LEDs (RCLEDs) are formed and wherein a GaN modified planar region is capable of being fabricated to a high resolution and thus create a well-defined cavity diameter (aperture).

10. The fabrication process according to claim 1, wherein Vertical Cavity Surface Emitting Lasers (VCSELs) are formed and wherein GaN modification provides a route to maintaining a low-loss planar high reflectivity DBR mirror above the p-GaN material whilst allowing the current to be precisely channeled into the required active region.

11. The fabrication process according to claim 1, further comprising forming microlens structures, scattering structures, diffractive optical elements, or photonic crystals on a light emitting surface of a microLED device.

12. A fabrication process for electronic components comprising the following steps:
   depositing a spreading layer on top of a GAN p-layer;
   depositing a mask feature onto the spreading layer to form a structure with at least part of the structure protected by the mask feature and at least another part of the structure not protected by the mask feature;
   exposing the structure including the mask feature to a plasma treatment;
   removing the mask from the structure after exposing the structure to the plasma treatment and prior to annealing the plasma treated structure; and
   annealing the plasma treated structure;
   wherein the at least other part of the structure not protected by the mask feature is exposed to the plasma treatment and forms a modified p-GaN region that behaves in an n-like manner and blocks current flow due to the plasma treatment and annealing process and the at least part of the structure protected by the mask are shielded from the plasma treatment and forms a conductive contact after annealing.

13. The fabrication process according to claim 12, wherein the annealed structure includes at least one of: a CLED; a VCSEL; a structure with small planar pixels; a semiconductor; a structures with graded/patterned p-contact resistance; and a structure with electrical isolation.

14. The fabrication process according to claim 12, wherein the spreading layer has a thickness of about 20 nm on top of the GaN p-layer.

15. The fabrication process according to claim 12, wherein the structure formed includes any of the following: a RCLED; a VCSEL; a structure with small planar pixels; a semiconductor; a structure with patterned/graded p-contact resistance; and a structure with modified p-regions that behave in an n-like manner and block current flow.

16. Modified structures formed by a process comprising the following steps:
   depositing a spreading layer on top of a GaN p-layer to form a structure;
   depositing a mask feature onto the structure with at least a part of the structure are protected by the mask feature and at least another part of the structure not protected by the mask feature;
   exposing the structure to a plasma treatment;
   removing the mask from the structure after exposing the structure to the plasma treatment and prior to annealing the plasma treated structure; and
   annealing the plasma treated structure;
   wherein the at least another part of the structure not protected by the mask feature is exposed to the plasma treatment and forms a modified p-region that behaves in an n-like manner and blocks current flow due to the plasma treatment and annealing process and the at least part of the structure protected by the mask feature are shielded from the plasma treatment and forms an ohmic contact after annealing.

17. The modified structures according to claim 16, wherein the structures formed include any of the following: RCLEDs; VCSELs; structures with small planar pixels; semiconductors; structures with patterned/graded p-contact resistance and structures with modified p-regions that behave in an n-like manner and block current flow.

* * * * *

UNITED STATES PATENT AND TRADEMARK OFFICE
CERTIFICATE OF CORRECTION

PATENT NO. : 10,211,371 B2
APPLICATION NO. : 15/118684
DATED : February 19, 2019
INVENTOR(S) : James Ronald Bonar et al.

Page 1 of 1

It is certified that error appears in the above-identified patent and that said Letters Patent is hereby corrected as shown below:

In the Claims

Column 19, Claim 13, Line 4, delete "a structures with" and insert -- a structure with --.

Column 20, Claim 16, Line 6, delete "with at least a part of the structure are protected by" and insert -- with at least a part of the structure protected by --.

Signed and Sealed this
Twenty-fifth Day of June, 2019

Andrei Iancu
*Director of the United States Patent and Trademark Office*